(12) United States Patent
Kuwahara et al.

(10) Patent No.: US 9,539,607 B2
(45) Date of Patent: Jan. 10, 2017

(54) SUBSTRATE PROCESSING APPARATUS AND SUBSTRATE PROCESSING METHOD

(71) Applicants: DAINIPPON SCREEN MFG. CO., LTD., Kyoto (JP); SOKUDO CO., LTD., Kyoto (JP)

(72) Inventors: Joji Kuwahara, Kyoto (JP); Takashi Taguchi, Kyoto (JP); Masahito Kashiyama, Kyoto (JP); Kohei Iwasaki, Kyoto (JP)

(73) Assignees: SCREEN Holdings Co., Ltd. (JP); SCREEN Semiconductor Solutions Co., Ltd. (JP)

( * ) Notice: Subject to any disclaimer, the term of this patent is extended or adjusted under 35 U.S.C. 154(b) by 44 days.

(21) Appl. No.: 13/944,237

(22) Filed: Jul. 17, 2013

(65) Prior Publication Data
US 2014/0023776 A1 Jan. 23, 2014

(30) Foreign Application Priority Data
Jul. 19, 2012 (JP) .................................. 2012-160395

(51) Int. Cl.
*B05C 13/00* (2006.01)
*H01L 21/67* (2006.01)
*H01L 21/68* (2006.01)

(52) U.S. Cl.
CPC ......... *B05C 13/00* (2013.01); *H01L 21/67259* (2013.01); *H01L 21/681* (2013.01)

(58) Field of Classification Search
None
See application file for complete search history.

(56) References Cited

U.S. PATENT DOCUMENTS

| 4,559,718 | A * | 12/1985 | Tadokoro ........................ 34/317 |
| 6,368,049 | B1 | 4/2002 | Osaka et al. .................. 414/783 |
| 2002/0070095 | A1 | 6/2002 | Osaka et al. .................. 198/394 |

(Continued)

FOREIGN PATENT DOCUMENTS

| JP | 11-195686 A | 7/1999 |
| JP | 2002-043394 A | 2/2002 |

(Continued)

OTHER PUBLICATIONS

Notice of Reasons for Refusal dated May 17, 2016 for corresponding Japanese Application No. 2012-160395.

*Primary Examiner* — Dah-Wei D Yuan
*Assistant Examiner* — Jethro M Pence
(74) *Attorney, Agent, or Firm* — Ostrolenk Faber LLP

(57) ABSTRACT

A substrate is transported based on coordinates information indicating a receiving position of the substrate and a placement position of the substrate by a hand. If the substrate is shifted from a first position, the substrate is received by the hand while a center of the substrate is shifted from a normal position of the hand. The hand that holds the substrate is moved toward a second position. A plurality of portions at an outer periphery of the substrate are detected before the substrate is placed. A shift of the substrate with respect to the normal position of the hand is detected based on the detection result, and the coordinates information is corrected such that a shift between a position of the center of the substrate to be placed at the second position by the hand and the center of the second position is canceled.

7 Claims, 13 Drawing Sheets

(56) References Cited

U.S. PATENT DOCUMENTS

| | | | |
|---|---|---|---|
| 2007/0217760 A1 | 9/2007 | Shiono | 386/85 |
| 2008/0225261 A1 | 9/2008 | Hirayanagi | 355/72 |
| 2008/0226830 A1 | 9/2008 | Miyagi et al. | 427/402 |
| 2010/0172720 A1 | 7/2010 | Kondoh | 414/217 |
| 2011/0063588 A1* | 3/2011 | Kashiyama et al. | 355/27 |
| 2012/0037593 A1 | 2/2012 | Miyagi et al. | 216/37 |
| 2012/0045852 A1* | 2/2012 | Baccini et al. | 438/14 |
| 2012/0224945 A1 | 9/2012 | Douki et al. | 414/758 |
| 2014/0234991 A1 | 8/2014 | Douki et al. | 438/5 |

FOREIGN PATENT DOCUMENTS

| | | |
|---|---|---|
| JP | 2005-101080 | 4/2005 |
| JP | 2008-060302 | 3/2008 |
| JP | 2008-311303 | 12/2008 |
| JP | 2009-071008 A | 4/2009 |
| JP | 2012-182393 | 9/2012 |
| TW | 451384 B | 8/2001 |
| TW | 200901279 A | 1/2009 |
| TW | I335020 B | 12/2010 |

\* cited by examiner

F I G. 8 (a) FIRST AND SECOND POSITIONS
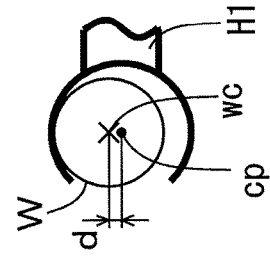
RECEIVING SUBSTRATE
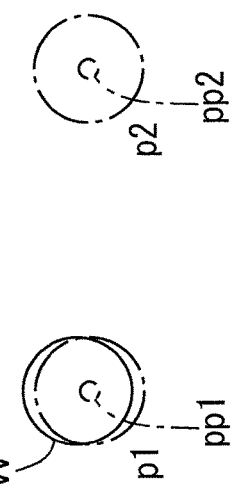
PLACING SUBSTRATE
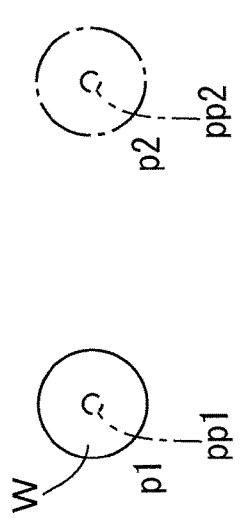
F I G. 8 (b) WHEN SUBSTRATE IS SHIFTED FROM FIRST POSITION
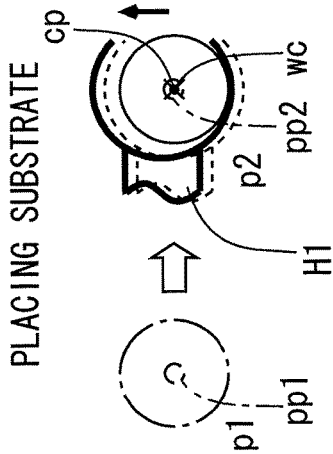
RECEIVING SUBSTRATE
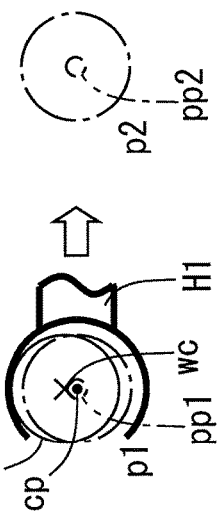
PLACING SUBSTRATE
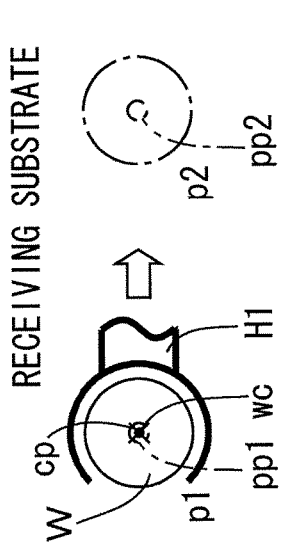
F I G. 8 (c) DETECTING SHIFT
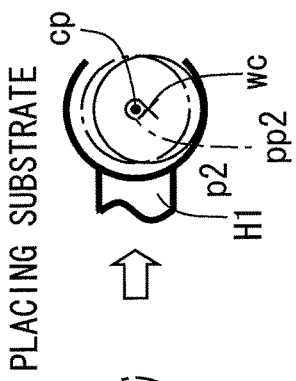
PLACING SUBSTRATE
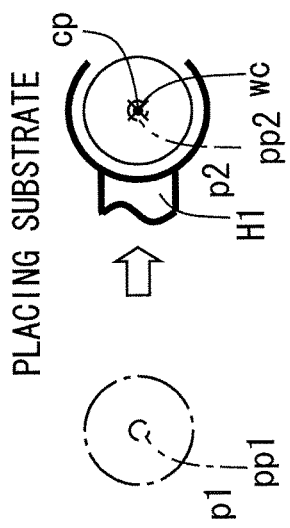

SUBSTRATE PROCESSING APPARATUS AND SUBSTRATE PROCESSING METHOD

BACKGROUND OF THE INVENTION (1) Field of the Invention

This invention relates to a substrate processing apparatus and a substrate processing method that perform predetermined processing on a substrate.

(2) Description of Related Art

Substrate processing apparatuses are used to subject various types of substrates such as semiconductor substrates, substrates for liquid crystal displays, plasma displays, optical disks, magnetic disks, magneto-optical disks, and photomasks, and other substrates to various types of processing. Generally in such a substrate processing apparatus, a plurality of different processing are successively performed on one substrate. The substrate processing apparatus described in JP 2008-60302 A includes an indexer block, a processing block for an anti-reflection film, a processing block for a resist film, a development processing block, a processing block for a resist cover film, a resist cover film removal block, a cleaning/drying processing block and an interface block. An exposure device which is a separate external device from the substrate processing apparatus is arranged to be adjacent to the interface block.

In the substrate processing apparatus described above, the substrate carried in from the indexer block is transported to the exposure device via the interface block after anti-reflection film formation, resist film formation, and resist cover film formation are performed in the processing block for an anti-reflection film, the processing block for a resist film and the processing block for a resist cover film. The substrate is transported to the resist cover film removal block via the interface block after a resist film on the substrate is exposed in a predetermined pattern in the exposure device. The substrate from which a resist cover film is removed in the resist cover film removal block is transported to the development processing block. The substrate is transported to the indexer block after development processing is performed on the resist film on the substrate in the development processing block such that the resist film having the predetermined pattern is formed.

A film formed at a peripheral edge of the substrate before exposure processing may be stripped due to a mechanic contact at the time of transportation of the substrate and become particles. In JP 2008-60302 A, a removal liquid is discharged to the peripheral edge of the substrate after each formation of the anti-reflection film, the resist film and the resist cover film. Thus, the film at the peripheral edge of the substrate is removed.

BRIEF SUMMARY OF THE INVENTION

In recent years, there has been a demand to increase a number of chips obtained from one wafer as well as to further refine an exposure pattern. Therefore, a removal region of the film formed at the peripheral edge of the substrate is required to be as small as possible. In this case, the film formed at the peripheral edge of the substrate needs to be accurately removed.

In JP 2008-60302 A, each of a plurality of coating units for forming the film on the substrate is provided with two guide arms, for example, in order to accurately remove the film formed at the peripheral edge of the substrate. In each coating unit, the two guide arms are moved toward an axis of a spin chuck while the substrate carried in from outside is placed on the spin chuck. The substrate is sandwiched and held between the two guide arms on the spin chuck such that a position of the substrate is corrected.

In this state, the substrate is held by suction by the spin chuck. Thereafter, a coating liquid is supplied to the substrate held by the spin chuck, and the film is formed on the substrate. Subsequently, the removal liquid is supplied toward the peripheral edge of the substrate from a needle-shaped nozzle. Thus, the film formed at the peripheral edge of the substrate is removed.

As described above, if the configuration for correcting the position of the substrate is provided in each coating unit (the guide arms in the example described above), the configuration of each coating unit becomes complicated. Further, a manufacturing cost for each coating unit increases as a number of components increases. Furthermore, if the position of the substrate is corrected by moving the two guide arms every time the substrate is placed on the spin chuck as described above, throughput in substrate processing is reduced.

An object of the present invention is to provide a substrate processing apparatus and a substrate processing method that can improve processing accuracy of a substrate while suppressing an increase in cost with a simple configuration without reducing throughput in substrate processing.

(1) According to one aspect of the present invention, a substrate processing apparatus that performs processing on a substrate includes a processing unit that has a supporter supporting the substrate and is configured to perform the processing on the substrate held by the supporter, a transport device that has a first holder configured to hold the substrate and is configured to transport the substrate by moving the first holder, a storage that stores control information for controlling the transport device such that the first holder of the transport device places the substrate at a predetermined position of the supporter of the processing unit, a controller that controls the transport device based on the control information stored by the storage, and a plurality of detectors provided to detect a plurality of portions at an outer periphery of the substrate being moved by the first holder before the first holder places the substrate on the supporter, wherein the controller is configured to correct the control information based on output signals of the plurality of detectors before the first holder places the substrate on the supporter such that a shift between a position of the substrate to be placed on the supporter by the first holder and the predetermined position is canceled, and control the transport device based on the corrected control information.

In the substrate processing apparatus, the control information for controlling the transport device is stored in the storage such that the first holder of the transport device places the substrate at the predetermined position of the supporter of the processing unit. The controller controls the transport device based on the control information stored by the storage. Thus, the substrate held by the first holder of the transport device is transported.

The plurality of portions at the outer periphery of the substrate being moved by the first holder are respectively detected before the substrate is placed on the supporter by the first holder. Further, the control information is corrected based on the output signals of the plurality of detectors before the substrate is placed on the supporter by the first holder such that the shift between the position of the substrate to be placed on the supporter by the first holder and the predetermined position is canceled. The transport device is controlled based on the corrected control information, and the substrate held by the first holder is placed at the predetermined position of the supporter of the processing unit. Thereafter, the processing is performed on the substrate supported by the support member. Thus, even if the position of the substrate held by the first holder is shifted from a normal position, the substrate can be accurately placed at the predetermined position on the supporter without separately providing a mechanism for correcting a shift of the substrate with respect to the first holder or a mechanism for correcting a shift in the position of the substrate with respect to the supporter. Therefore, the processing accuracy of the substrate can be improved while an increase in cost is suppressed. Further, because the plurality of portions at the outer periphery of the substrate being moved by the first holder are detected, it is not necessary to stop the movement of the substrate in order to detect a shift in the position of the substrate. Therefore, the throughput in the substrate processing is not reduced.

As a result, the processing accuracy of the substrate can be improved while an increase in cost is suppressed without reducing the throughput in the substrate processing.

(2) The first holder may have a suction holding mechanism that sucks one surface of the substrate.

When the substrate is held by the first holder while the one surface of the substrate is sucked, the suction of the substrate by the suction holding mechanism must be essentially released in order to correct a shift in the position of the substrate with respect to the first holder.

Because the configuration of the present invention enables a shift in the position of the substrate with respect to the supporter to be corrected without correcting a shift in the position of the substrate with respect to the first holder, it is not necessary to release the suction of the substrate. Therefore, the throughput in the substrate processing is not reduced.

Further, because the substrate is moved while being sucked by the suction holding mechanism, a position of the substrate with respect to the first holder does not change after the detection of a plurality of portions at an outer periphery of the substrate by the plurality of detectors. Therefore, the substrate is accurately placed at the predetermined position on the supporter, so that the processing accuracy of the substrate can be improved.

(3) Each of the plurality of detectors may be configured to emit light to a moving path of the substrate held by the first holder, and receive reflection light or transmitting light from the moving path as returning light to output a signal indicating presence/absence of receipt of the returning light as detection result.

In this case, the plurality of portions at the outer periphery of the substrate moved by the first holder are accurately easily detected in a non-contacting method.

(4) The controller may be configured to detect time points at which the plurality of portions at the outer periphery of the substrate are detected by the plurality of detectors based on the output signals of the plurality of detectors and correct the control information based on the detected respective time points such that the shift between the position of the substrate to be placed on the supporter by the first holder and the predetermined position is canceled.

In this case, the control information is corrected based on the respective time points at which the plurality of portions at the outer periphery of the substrate are detected by the plurality of detectors such that the shift between the position of the substrate to be placed on the supporter by the first holder and the predetermined position is canceled. Thus, the control information can be corrected in a short period of time without performing complicated processing such as image processing.

(5) The plurality of detectors may include not less than three detectors provided to respectively detect not less than three portions at the outer periphery of the substrate being moved by the first holder.

In this case, even if a diameter of the substrate is not known, the shift in the position of the substrate can be detected. Further, if the diameter of the substrate is known, the shift in the position of the substrate can be detected regardless of a position of a cutout at an outer periphery of the substrate.

(6) The supporter may include a rotating and holding device holds and rotates the substrate in a horizontal attitude, and the processing unit may further include a film processing device that performs processing on a film on the substrate held by the rotating and holding device.

In this case, because the substrate is placed at a predetermined position of the rotating and holding device, the processing can be accurately performed by the film processing device on the film on the substrate held by the rotating and holding device.

(7) The film processing device may include a film removal mechanism configured to remove a peripheral edge of the film on the substrate held by the rotating and holding device.

In this case, because the substrate is accurately placed at a predetermined position of the rotating and holding device, a region with a constant width at the peripheral edge of the film on the substrate can be accurately removed by the film removal mechanism.

(8) The film processing device may include a light irradiation mechanism configured to irradiate a peripheral edge of the film on the substrate held by the rotating and holding device with exposure light.

In this case, because the substrate is accurately placed at a predetermined position of the rotating and holding device, a region with a constant width at the peripheral edge of the film on the substrate can be accurately irradiated with the exposure light by the light irradiation mechanism.

(9) The processing unit may further include a temperature processing device that performs temperature processing on the substrate, and the supporter may include a supporting member that supports the substrate on an upper surface of the temperature processing device.

In this case, the substrate is accurately placed at a predetermined position of the support member, so that the temperature processing can be accurately performed on the substrate by the temperature processing apparatus.

(10) The transport device may further have a second holder configured to hold the substrate, and may be configured to transport the substrate by moving the second holder, the storage may store control information for controlling the transport device such that the second holder of the transport device places the substrate at the predetermined position of the supporter of the processing unit, the plurality of detectors may be provided to detect a plurality of portions at an outer periphery of the substrate being moved by the second holder before the second holder places the substrate on the supporter, and the controller may be configured to correct the control information based on output signals of the plurality of detectors before the second holder places the substrate on the supporter such that a shift between a position of the substrate to be placed on the supporter by the second holder and the predetermined position is canceled, and control the transport device based on the corrected control information.

In this case, the control information for controlling the transport device is stored in the storage such that the second holder of the transport device places the substrate on the predetermined position of the supporter of the processing unit. The controller controls the transport device based on the control information stored by the storage. Thus, the substrate held by the second holder of the transport device is transported.

The plurality of portions at the outer periphery of the substrate being moved by the second holder are respectively detected before the substrate is placed on the supporter by the second holder. Further, the control information is corrected based on the output signals of the plurality of detectors before the substrate is placed on the supporter by the second holder such that the shift between the position of the substrate to be placed on the supporter by the second holder and the predetermined position is canceled. The transport device is controlled based on the corrected control information, and the substrate held by the second holder is placed at the predetermined position of the supporter of the processing unit. Thereafter, the processing is performed on the substrate supported by the support member. Thus, even if the position of the substrate held by the second holder is shifted from the normal position, the substrate can be accurately placed at the predetermined position on the supporter without separately providing a mechanism for correcting a shift in the position of the substrate with respect to the second holder or a mechanism for correcting a shift in the position of the substrate with respect to the supporter.

The substrate is transported by the first holder and the second holder as described above such that the processing accuracy of the substrate can be improved while the throughput of the substrate processing is improved.

(11) According to another aspect of the present invention, a substrate processing method that performs processing on a substrate using a substrate processing apparatus, the substrate processing apparatus includes a processing unit that has a supporter supporting the substrate and is configured to perform the processing on the substrate supported by the supporter, and a transport device that has a holder configured to hold the substrate and is configured to transport the substrate by moving the holder, and the substrate processing method includes the steps of storing control information for controlling the transport device such that the holder of the transport device places the substrate on a predetermined position of the supporter of the processing unit, detecting a plurality of portions at an outer periphery of the substrate being moved by the holder by a plurality of detectors before the holder places the substrate on the supporter, correcting the control information based on output signals of the plurality of detectors before the holder places the substrate on the supporter such that a shift between a position of the substrate to be placed on the supporter by the holder and the predetermined position is canceled, controlling the transport device based on the corrected control information such that the holder of the transport device places the substrate at the predetermined position of the supporter of the processing unit, and performing the processing on the substrate by the processing unit after the substrate is placed at the predetermined position of the supporter of the processing unit.

In the substrate processing method, the control information for controlling the transport device is stored such that the holder of the transport device places the substrate at the predetermined position of the supporter of the processing unit. The transport device is controlled based on the stored control information such that the substrate held by the holder of the transport device is transported.

The plurality of portions at the outer periphery of the substrate being moved by the holder are respectively detected before the substrate is placed on the supporter by the holder. Further, the control information is corrected based on the output signals of the plurality of detectors before the substrate is placed on the supporter by the holder such that the shift between the position of the substrate to be placed on the supporter by the holder and the predetermined position is canceled. The transport device is controlled based on the corrected control information, and the substrate held by the holder is placed at the predetermined position of the supporter of the processing unit. Thereafter, the processing is performed on the substrate supported by the support member. Thus, even if the position of the substrate held by the holder is shifted from the normal position, the substrate can be accurately placed at the predetermined position on the supporter without providing a mechanism for correcting a shift in the position of the substrate with respect to the holder or a mechanism for correcting a shift in the position of the substrate with respect to the supporter. Therefore, the processing accuracy of the substrate can be improved while an increase in cost is suppressed. Further, because the plurality of portions at the outer periphery of the substrate being moved by the holder are detected, it is not necessary to stop the movement of the substrate in order to detect the shift in the position of the substrate. Therefore, the throughput in the substrate processing is not reduced.

As a result, processing accuracy of the substrate can be improved while an increase in the cost is suppressed with a simple configuration without reducing throughput in the substrate processing.

Other features, elements, characteristics, and advantages of the present invention will become more apparent from the following description of preferred embodiments of the present invention with reference to the attached drawings.

BRIEF DESCRIPTION OF THE SEVERAL VIEWS OF THE DRAWING

FIGS. 8(a) to 8(c) are diagrams for explaining the summary of the operation of the transport mechanism of FIG. 6;

DESCRIPTION OF THE PREFERRED EMBODIMENTS

A substrate processing apparatus, a substrate processing method according to an embodiment of the present invention will be described below with reference to the drawings. In the following description, a substrate refers to a semiconductor substrate, a substrate for a liquid crystal display, a substrate for a plasma display, a glass substrate for a photomask, a substrate for an optical disc, a substrate for a magnetic disc, a substrate for a magneto-optical disc, a substrate for a photomask or the like.

(1) Configuration of the Substrate Processing System

Figure 1:
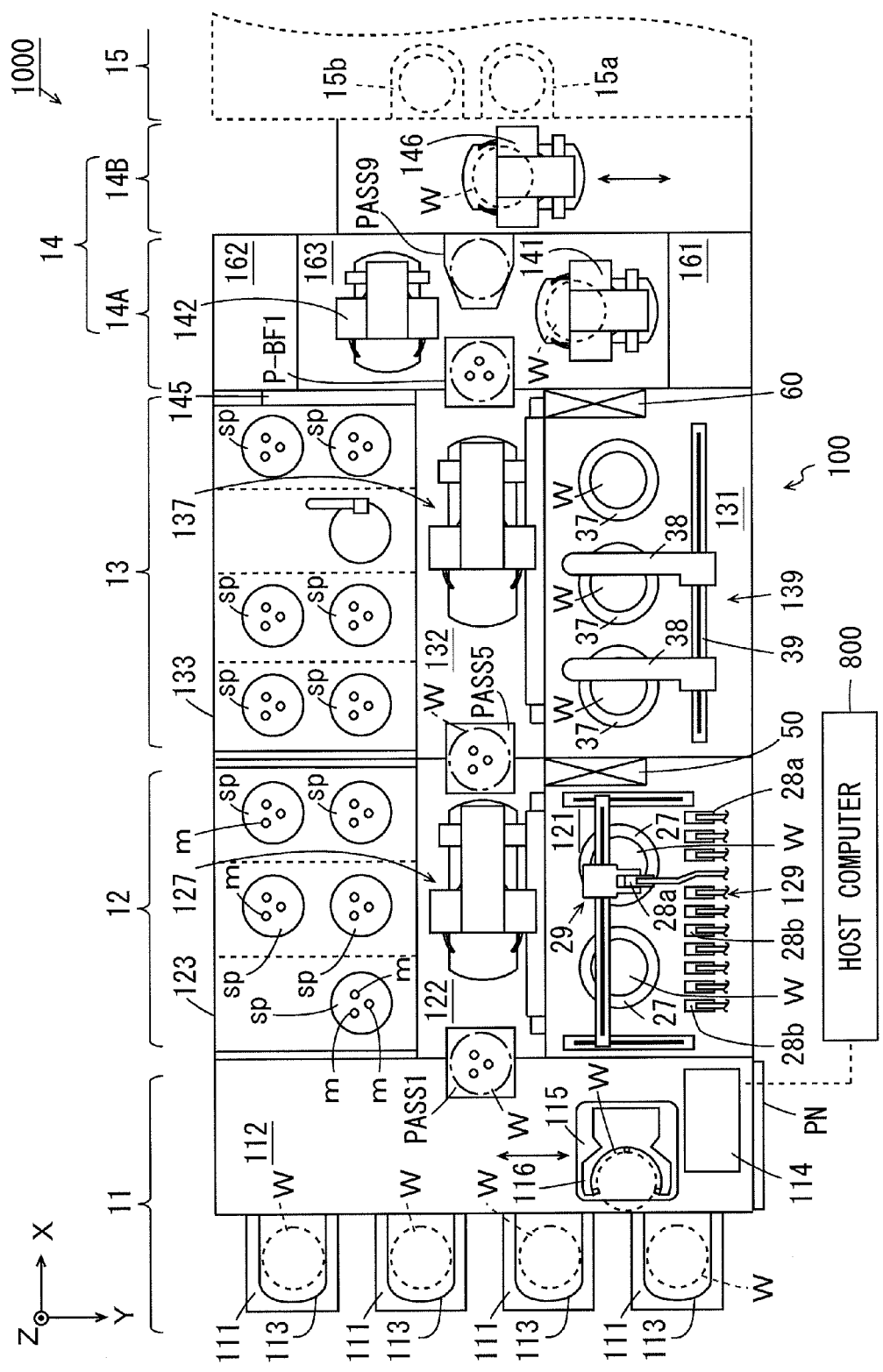
FIG. 1 is a schematic plan view of a substrate processing system according to one embodiment of the present invention.

FIG. 1 is a schematic plan view of the substrate processing system according to one embodiment of the present invention.

Figure 2:
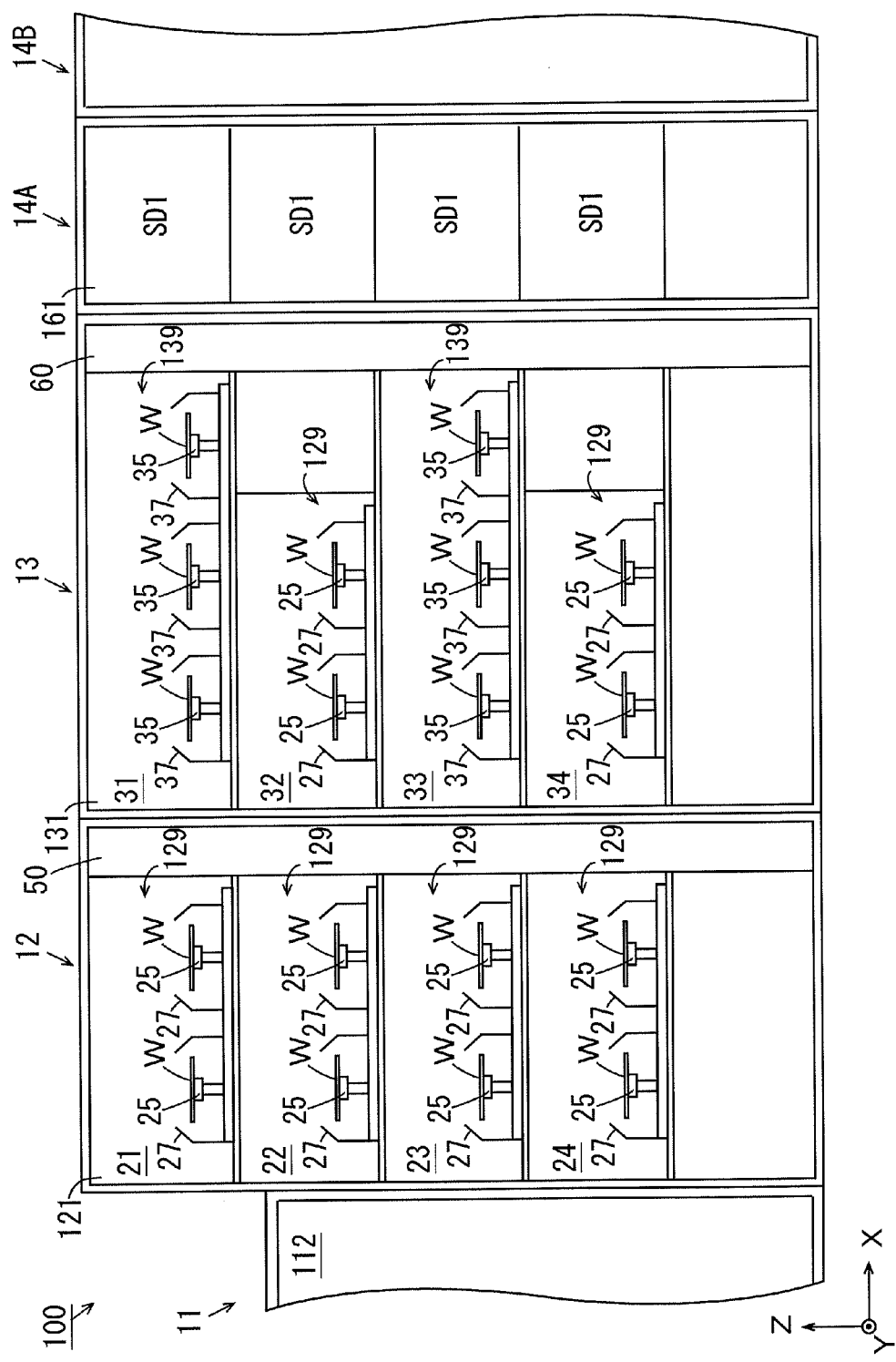
FIG. 2 is a side view of one side of the substrate processing system mainly showing a coating processing section, a coating/development processing section and a cleaning/drying processing section of FIG. 1.

FIGS. 1, 2 and subsequent given figures are accompanied by the arrows that indicate X, Y, and Z directions orthogonal to one another for the clarity of a positional relationship. The X and Y directions are orthogonal to each other within a horizontal plane, and the Z direction corresponds to a vertical direction. In each of the directions, a direction directed by the arrow is a + direction, and a direction opposite thereto is a − direction.

As shown in FIG. 1, the substrate processing system 1000 includes the substrate processing apparatus 100 and a host computer 800.

The substrate processing apparatus 100 includes an indexer block 11, a first processing block 12, a second processing block 13, a cleaning/drying processing block 14A and a carry-in/carry-out block 14B. The cleaning/drying processing block 14A and the carry-in/carry-out block 14B constitute an interface block 14. An exposure device 15 is arranged to be adjacent to the carry-in/carry-out block 14B. In the exposure device 15, a substrate W is subjected to exposure processing using an immersion method.

As shown in FIG. 1, the indexer block 11 includes a plurality of carrier platforms 111 and a transport section 112. Each carrier 113 that stores a plurality of substrates W in multiple stages is placed on each of the carrier platforms 111.

The transport section 112 is provided with a controller 114 and a transport mechanism 115. The controller 114 controls various constituent elements in the substrate processing apparatus 100. The controller 114 is connected to the host computer 800 by wire communication or wireless communication. Various types of data are transmitted and received between the controller 114 and the host computer 800.

Figure 5:
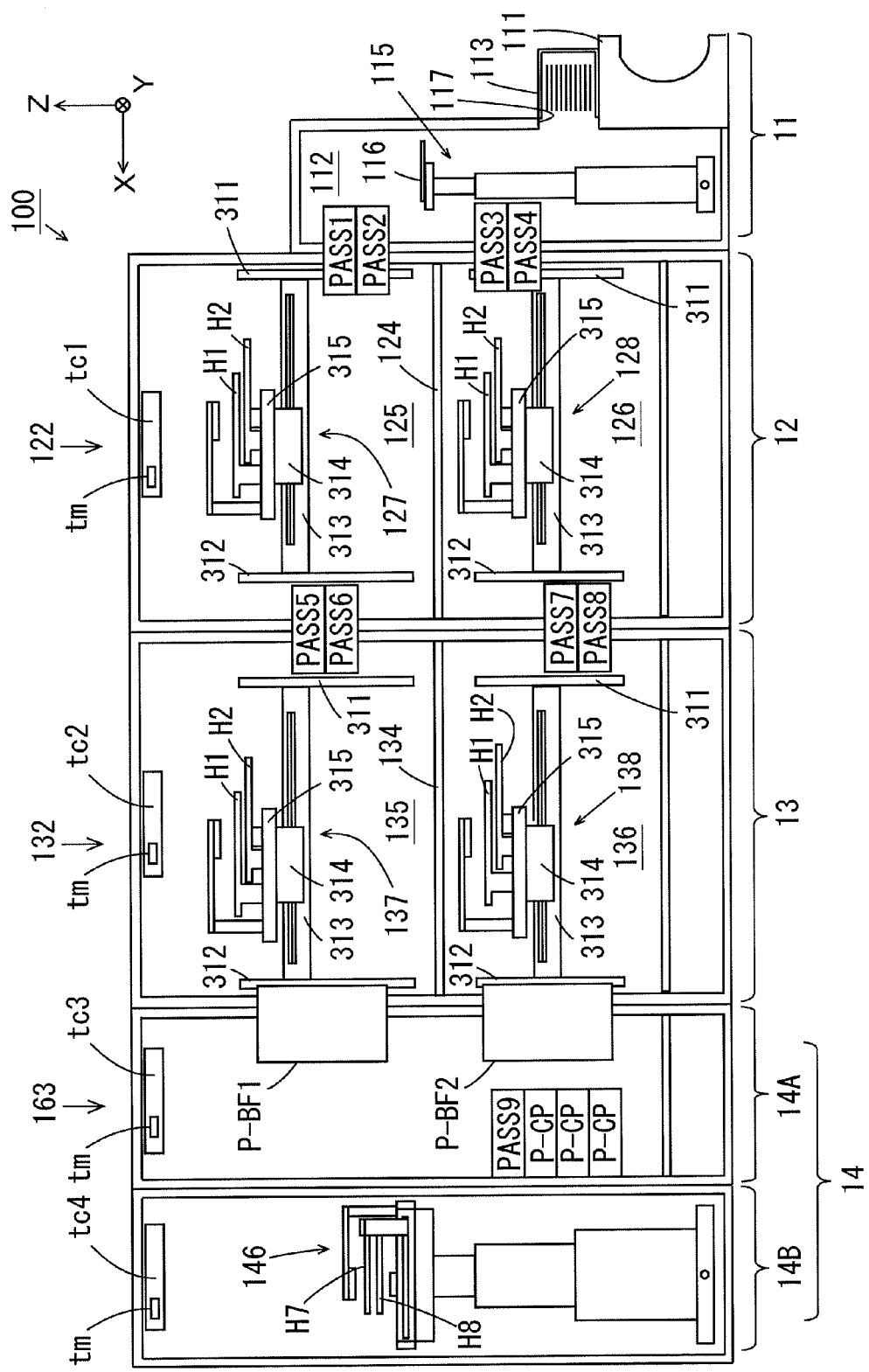
FIG. 5 is a side view mainly showing the transport section of FIG. 1.

The transport mechanism 115 has a hand 116 for holding the substrate W. The transport mechanism 115 transports the substrate W while holding the same using the hand 116. As shown in FIG. 5, described below, an opening 117 for receiving and transferring the substrate W between the carrier 113 and the transport mechanism 115 is formed in the transport section 112.

A main panel PN is provided on the side surface of the transport section 112. The main panel PN is connected to the controller 114. A user can confirm a processing status of the substrate W in the substrate processing apparatus 100 using the main panel PN.

An operation unit 90 (see FIG. 11, described below) composed of a keyboard, for example, is provided in the vicinity of the main panel PN. The user can perform operation setting of the substrate processing apparatus 100 and the like by operating the operation unit 90.

The first processing block 12 includes a coating processing section 121, a transport section 122 and a thermal processing section 123. The coating processing section 121 and the thermal processing section 123 are provided to be opposite to each other with the transport section 122 sandwiched therebetween. A substrate platform PASS1 and substrate platforms PASS2 to PASS4 (see FIG. 5), described below, on which the substrates W are to be placed, are provided between the transport section 122 and the indexer block 11. A transport mechanism 127 and a transport mechanism 128 (see FIG. 5), described below, that transport the substrates W are provided in the transport section 122.

The second processing block 13 includes a coating/development processing section 131, a transport section 132 and a thermal processing section 133. The coating/development processing section 131 and the thermal processing section 133 are provided to be opposite to each other with the transport section 132 sandwiched therebetween. A substrate platform PASS5 and substrate platforms PASS6 to PASS8 (see FIG. 5), described below, on which the substrates W are to be placed are provided between the transport section 132 and the transport section 122. The transport section 132 is provided with a transport mechanism 137 and a transport mechanism 138 (see FIG. 5), described below, that transport the substrates W. In the second processing block 13, a packing 145 is provided between the thermal processing section 133 and the interface block 14.

The cleaning/drying processing block 14A includes cleaning/drying processing sections 161, 162 and a transport section 163. The cleaning/drying processing sections 161, 162 are opposite to each other with the transport section 163 sandwiched therebetween. The transport section 163 is provided with the transport mechanisms 141, 142.

A placement/buffer section P-BF1 and a placement/buffer section P-BF2 (see FIG. 5), described below, are provided between the transport section 163 and the transport section 132. Each of the placement/buffer sections P-BF1, P-BF2 is configured to be capable of storing the plurality of substrates W.

A substrate platform PASS9 and placement/cooling units P-CP (see FIG. 5), described below, are provided to be adjacent to the carry-in/carry-out block 14B between the transport mechanisms 141, 142. Each placement/cooling unit P-CP includes a support plate (e.g., a cooling plate) that cools the substrate W and a plurality of support members. The plurality of support members are provided on the support plate and support a back surface of substrate W. In each placement/cooling unit P-CP, the substrate W is cooled to a temperature suitable for exposure processing.

The carry-in/carry-out block 14B is provided with a transport mechanism 146. The transport mechanism 146 carries in and carries out the substrate W to/from the exposure device 15. The exposure device 15 is provided with a substrate carry-in section 15a for carrying in the substrate W and a substrate outlet 15b for carrying out the substrate W.

(2) Configuration of the Coating Processing Section and the Development Processing Section FIG. 2 is a side view of one side of the substrate processing system 1000 mainly showing the coating processing section 121, the coating/development processing section 131 and the cleaning/drying processing section 161 of FIG. 1.

As shown in FIG. 2, the coating processing section 121 has coating processing chambers 21, 22, 23, 24 provided in a stack. Each of the coating processing chambers 21 to 24 is provided with a coating processing unit 129. The coating/development processing section 131 has development processing chambers 31, 33 and coating processing chambers 32, 34 provided in a stack. Each development processing chamber 31, 33 is provided with a development processing unit 139, and each coating processing chamber 32, 34 is provided with the coating processing unit 129.

Each coating processing unit 129 includes spin chucks 25 that hold the substrates W and cups 27 provided to cover the surroundings of the spin chucks 25. In the present embodiment, each coating processing unit 129 is provided with two spin chucks 25 and two cups 27. The spin chucks 25 are driven to be rotated by a driving device (an electric motor, for example) that is not shown.

Further, as shown in FIG. 1, each coating processing unit 129 includes a plurality of nozzles 28a, 28b that discharge a processing liquid and a nozzle transport mechanism 29 that transports the nozzles 28a, 28b.

In the coating processing unit 129, one of the plurality of nozzles 28a, 28b is moved to above the substrate W by the nozzle transport mechanism 29. Then, the processing liquid is discharged from the nozzle such that the processing liquid is supplied on the substrate W. When the processing liquid is supplied to the substrate W from the one of the plurality of nozzles 28a, 28b, the spin chuck 25 is rotated by a driving device (not shown). Thus, the substrate W is rotated.

In the present embodiment, a processing liquid for an anti-reflection film is supplied to the substrate W from each nozzle 28a in the coating processing unit 129 in the coating processing chamber 22, 24. Thereafter, a removal liquid that can melt the anti-reflection film is supplied from each nozzle 28b to a region with a constant width at the peripheral edge of the substrate W. Thus, the processing liquid for the anti-reflection film applied to the peripheral edge of the substrate W is removed.

In the coating processing unit 129 in the coating processing chamber 21, 23, a processing liquid for a resist film is supplied to the substrate W from the nozzle 28a. Thereafter, a removal liquid that can melt the resist film is supplied from the nozzle 28b to the peripheral edge of the substrate W. Thus, the processing liquid for the resist film applied to the peripheral edge of the substrate W is removed.

In the coating processing unit 129 in the coating processing chamber 32, 24, a processing liquid for a resist cover film is supplied to the substrate W from the nozzle 28a. Thereafter, a removal liquid that can melt the resist cover film is supplied from the nozzle 28b to a region with a constant width in the peripheral edge of the substrate W. Thus, the processing liquid for the resist cover film applied to the peripheral edge of the substrate W is removed.

Here, in the present embodiment, a main surface of the substrate W refers to a surface to which the processing liquid for the anti-reflection film, the processing liquid for the resist film and the processing liquid for the resist cover film, described above, are applied, and a back surface of the substrate W refers to the other surface of the substrate W on the opposite side of the main surface.

As described above, while the processing liquid for the anti-reflection film or the resist film applied to the peripheral edge of the substrate W is removed after the processing liquid for the anti-reflection film or the resist-film is applied on the main surface of the substrate W in this example, the invention is not limited to this. Thermal processing may be performed on the substrate W in the thermal processing section 123 (FIG. 1) after the processing liquid for the anti-reflection film or the resist film is applied on the main surface of the substrate W. Thereafter, the processing liquid for the anti-reflection film or the resist film applied on the peripheral edge of the substrate W may be removed.

As shown in FIG. 2, similarly to the coating processing unit 129, the development processing unit 139 includes spin chucks 35 and cups 37. Further, as shown in FIG. 1, the development processing unit 139 includes two slit nozzles 38 that discharge a development liquid and a moving mechanism 39 that moves the slit nozzles 38 in the X direction.

In the development processing unit 139, the one slit nozzle 38 first supplies the development liquid to each substrate W while being moved in the X direction. Thereafter, the other slit nozzle 38 supplies the development liquid to each substrate W while being moved. Note that, when the development liquid is supplied to the substrate W from each slit nozzle 38, each spin chuck 35 is rotated by a driving device (not shown). Thus, the substrate W is rotated.

In the present embodiment, the development liquid is supplied to the substrate W in the development processing unit 139 such that the resist cover film on the substrate W is removed and the development processing for the substrate W is performed. Further, in the present embodiment, the development liquids different from each other are discharged from the two slit nozzles 38. Thus, the two types of the development liquids can be supplied to each substrate W.

While the coating processing unit 129 has the two spin chucks 25 and the two cups 27, and the development processing unit 139 has the three spin chucks 35 and the three cups 37 in the example of FIG. 2, the invention is not limited to this. A number of the spin chucks 25, 35 and the cups 27, 37 can be arbitrarily changed.

A plurality of (four in this example) cleaning/drying processing units SD1 are provided in the cleaning/drying processing section 161. Each cleaning/drying processing unit SD1 includes a spin chuck and a cleaning liquid supply mechanism that are not shown. In the cleaning/drying processing unit SD1, cleaning and drying processing for the substrate W before the exposure processing are performed.

In the cleaning/drying processing unit SD1, polishing processing for the back surface of the substrate W and an end (a bevel portion) of the substrate W using a brush and the like may be performed. Here, the back surface of the substrate W refers to a surface of the substrate W on the opposite side of the surface on which various patterns such as a circuit pattern are formed.

As shown in FIGS. 1 and 2, a fluid box 50 is provided in the coating processing section 121 to be adjacent to the coating/development processing section 131. Similarly, a fluid box 60 is provided in the coating/development processing section 131 to be adjacent to the cleaning/drying processing block 14A. The fluid box 50 and the fluid box 60 each house fluid related elements such as a pipe, a joint, a valve, a flowmeter, a regulator, a pump, a temperature adjuster used to supply a chemical liquid to the coating processing units 129 and the development processing units 139 and discharge the chemical liquid and air out of the coating processing units 129 and the development processing units 139.

(3) Configuration of the Thermal Processing Section

Figure 3:
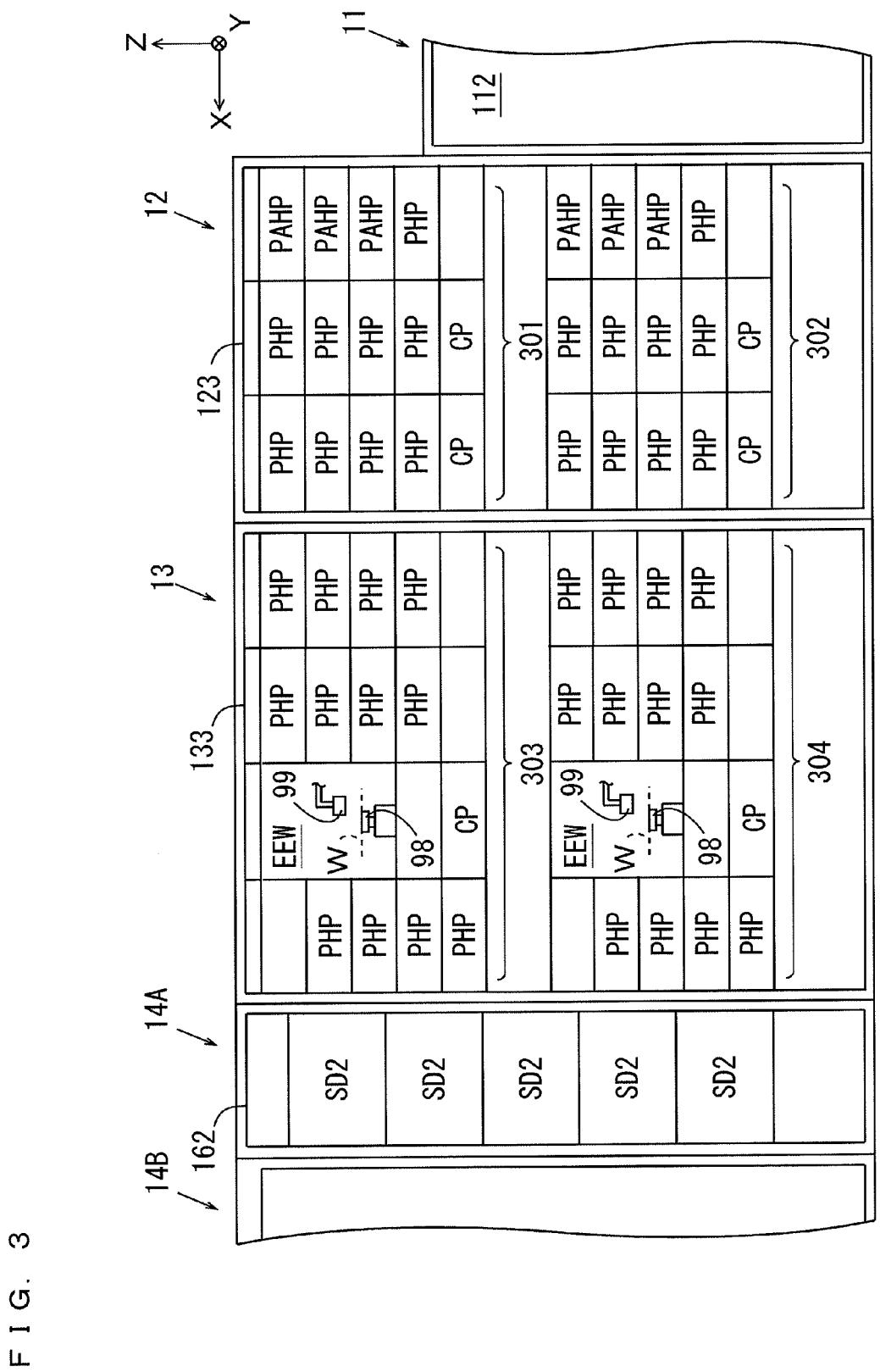
FIG. 3 is a side view of another side of the substrate processing system mainly showing a thermal processing section and the cleaning/drying processing section of FIG. 1.

FIG. 3 is a side view of another side of the substrate processing system 1000 mainly showing the thermal processing sections 123, 133 and the cleaning/drying processing section 162 of FIG. 1.

As shown in FIG. 3, the thermal processing section 123 has an upper thermal processing section 301 provided above and a lower thermal processing section 302 provided below. A plurality of thermal processing units PHP, a plurality of adhesion reinforcement processing units PAHP and a plurality of cooling units CP are provided in the upper thermal processing section 301 and the lower thermal processing section 302. A support plate sp (FIG. 1) for respectively performing temperature processing on the substrate W is provided in each thermal processing unit PHP, each adhesion reinforcement processing unit PAHP and each cooling unit CP. A plurality of support members m (FIG. 1) for supporting the back surface of the substrate W are provided on the upper surface of each support plate sp (FIG. 1).

Heating processing and cooling processing for the substrate W are performed on the support plate sp in the thermal processing unit PHP. In the adhesion reinforcement processing unit PAHP, adhesion reinforcement processing for improving adhesion between the substrate W and the anti-reflection film is performed on the support plate sp. Specifically, in the adhesion reinforcement processing unit PAHP, an adhesion agent such as HMDS (hexamethyldisilazane) is applied to the substrate W, and the heating processing is performed on the substrate W. In the cooling unit CP, the cooling processing for the substrate W is performed on the support plate sp.

The thermal processing section 133 has an upper thermal processing section 303 provided above and a lower thermal processing section 304 provided below. A cooling unit CP, a plurality of thermal processing units PHP and an edge exposure unit EEW are provided in each of the upper thermal processing section 303 and the lower thermal processing section 304.

Each edge exposure unit EEW includes a spin chuck 98 that holds the substrate by suction in a horizontal attitude while rotating the same, and a light emitter 99 that exposes the outer peripheral edge of the substrate W held on the spin chuck 98. In the edge exposure unit EEW, exposure processing (edge exposure processing) is performed on a region with a constant width at the peripheral edge of the resist film formed on the substrate W.

The edge exposure processing is performed on the substrate W such that the resist film on the peripheral edge of the substrate W is removed at the time of the subsequent development processing. Thus, when the peripheral edge of the substrate W comes in contact with another member after the development processing, generation of particles caused by stripping of the resist film on the peripheral edge of the substrate W is prevented.

A plurality of (five in this example) cleaning/drying processing units SD2 are provided in the cleaning/drying processing section 162. Each cleaning/drying processing unit SD2 includes a spin chuck and a cleaning liquid supply mechanism that are not shown. In the cleaning/drying processing unit SD2, the cleaning and drying processing for the substrate W after the exposure processing are performed.

(4) Configuration of the Transport Section

(4-1) Schematic Configuration

Figure 4:
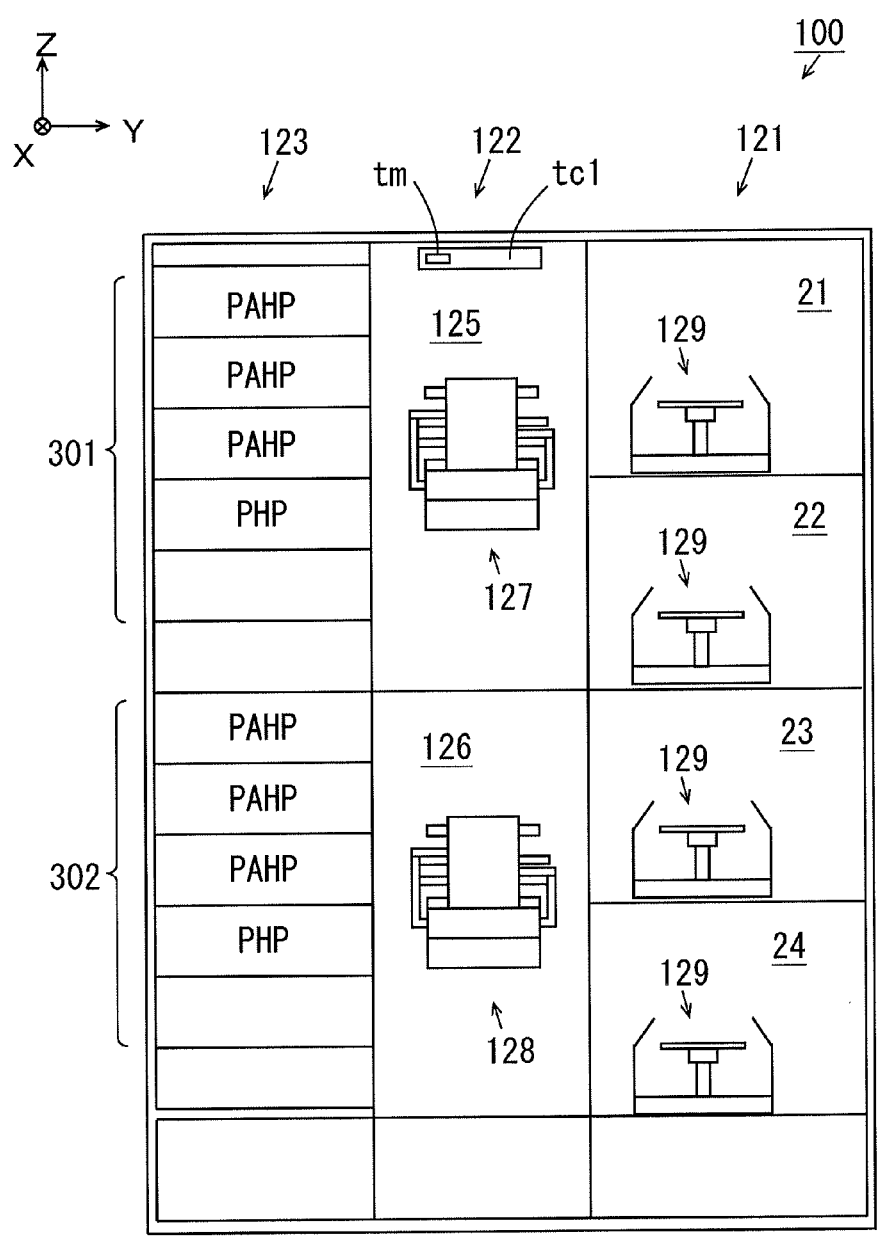
FIG. 4 is a side view mainly showing the coating processing section, a transport section and the thermal processing section of FIG. 1.

FIG. 4 is a side view mainly showing the coating processing section 121, the transport section 122 and the thermal processing section 123 of FIG. 1. FIG. 5 is a side view mainly showing the transport sections 122, 132, 163 of FIG. 1.

As shown in FIGS. 4 and 5, the transport section 122 has an upper transport chamber 125 and a lower transport chamber 126. The transport section 132 has an upper transport chamber 135 and a lower transport chamber 136.

The upper transport chamber 125 is provided with a transport mechanism 127, and the lower transport chamber 126 is provided with a transport mechanism 128. Further, the upper transport chamber 135 is provided with a transport mechanism 137, and the lower transport chamber 136 is provided with a transport mechanism 138.

As shown in FIG. 4, the upper thermal processing section 301 is provided to be opposite to the coating processing chambers 21, 22 with the upper transport chamber 125 sandwiched therebetween. The lower thermal processing section 302 is provided to be opposite to the coating processing chambers 23, 24 with the lower transport chamber 126 sandwiched therebetween. Similarly, the upper thermal processing section 303 (FIG. 3) is provided to be opposite to the development processing chamber 31 and the coating processing chamber 32 (FIG. 2) with the upper transport chamber 135 (FIG. 5) sandwiched therebetween. The lower thermal processing section 304 (FIG. 3) is provided to be opposite to the development processing chamber 33 and the coating processing chamber 34 (FIG. 2) with the lower transport chamber 136 (FIG. 5) sandwiched therebetween.

As shown in FIG. 5, the substrate platforms PASS1, PASS2 are provided between the transport section 112 and the upper transport chamber 125, and the substrate platforms PASS3, PASS4 are provided between the transport section 112 and the lower transport chamber 126. The substrate platforms PASS5, PASS6 are provided between the upper transport chamber 125 and the upper transport chamber 135, and the substrate platforms PASS7, PASS8 are provided between the lower transport chamber 126 and the lower transport chamber 136.

The placement/buffer section P-BF1 is provided between the upper transport chamber 135 and the transport section 163, and the placement/buffer section P-BF2 is provided between the lower transport chamber 136 and the transport section 163. The substrate platform PASS9 and the plurality of placement/cooling units P-CP are provided in the transport section 163 to be adjacent to the carry-in/carry-out block 14B.

The placement/buffer section P-BF1 is configured to be capable of carrying in and carrying out the substrate W by the transport mechanism 137 and the transport mechanisms 141, 142 (FIG. 1). The placement/buffer section P-BF2 is configured to be capable of carrying in and carrying out the substrate W by the transport mechanism 138 and the transport mechanisms 141, 142 (FIG. 1). Further, the substrate platform PASS9 and the placement/cooling unit P-CP are configured to be capable of carrying in and carrying out the substrate W by the transport mechanisms 141, 142 (FIG. 1) and the transport mechanism 146.

While the only one substrate platform PASS9 is provided in the example of FIG. 5, the plurality of substrate platforms PASS9 may be provided one above another. In this case, the plurality of substrate platforms PASS9 may be used as buffer units for temporarily placing the substrates W.

The substrates W transported from the indexer block 11 to the first processing block 12 are placed on the substrate platform PASS1 and the substrate platform PASS3. The substrates W transported from the first processing block 12 to the indexer block 11 are placed on the substrate platform PASS2 and the substrate platform PASS4.

The substrates W transported from the first block 12 to the second processing block 13 are placed on the substrate platform PASS5 and the substrate platforms PASS7. The substrates W transported from the second processing block 13 to the first processing block 12 are placed on the substrate platform PASS6 and the substrate platform PASS8.

The substrates W transported from the second processing block 13 to the cleaning/drying processing block 14A are placed on the placement/buffer sections P-BF1, P-BF2. The substrates W transported from the cleaning/drying processing block 14A to the carry-in/carry-out block 14B are placed on the placement/cooling units P-CP. The substrates W transported from the carry-in/carry-out block 14B to the cleaning/drying processing block 14A are placed on the substrate platform PASS9.

A controller tc1 for transportation is provided above the transport mechanism 127 in the upper transport chamber 125. The controller tc1 for transportation controls the operation of the transport mechanism 127 and the transport mechanism 128 provided in the transport section 122.

A controller tc2 for transportation is provided above the transport mechanism 137 in the upper transport chamber 135. The controller tc2 for transportation controls the operation of the transport mechanism 137 and the transport mechanism 138 provided in the transport section 132.

A controller tc3 for transportation is provided at an upper portion in the transport section 163 in the cleaning/drying processing block 14A. The controller tc3 for transportation controls the operation of the transport mechanism 141 and the transport mechanism 142 provided in the transport section 163.

A controller tc4 for transportation is provided at an upper portion in the carry-in/carry-out block 14B. The controller tc4 for transportation controls the operation of the transport mechanism 146 provided in the carry-in/carry-out block 14B.

Each of the controllers tc1 to tc4 for transportation contains a memory tm. Coordinates information, described below, is stored as the control information in the memory tm. Each of the controllers tc1 to tc4 for transportation controls the one or plurality of transport mechanisms based on the coordinates information stored in the memory tm.

(4-2) Configuration of the Transport Mechanism

Figure 6:
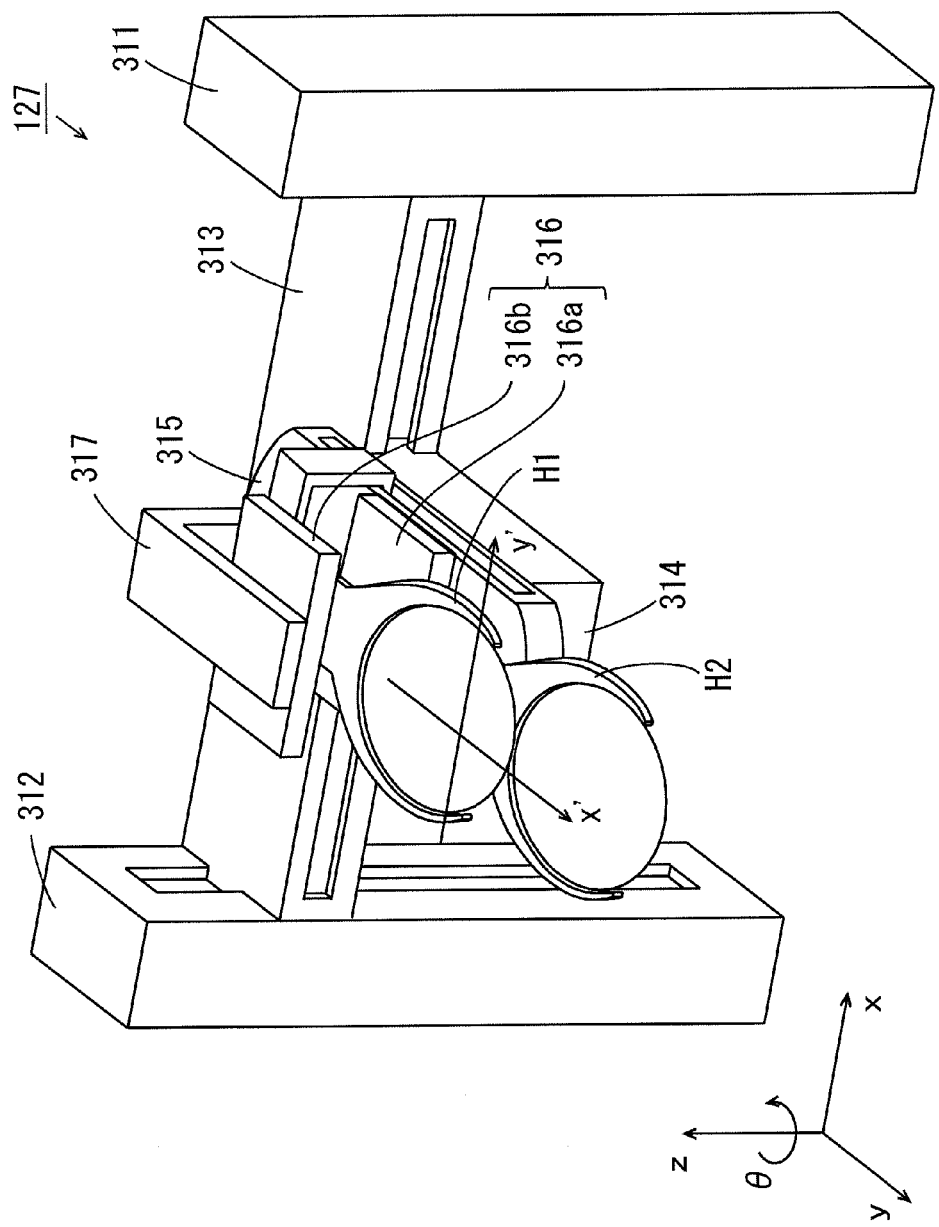
FIG. 6 is a perspective view showing a transport mechanism.

Next, the transport mechanism 127 will be described. FIG. 6 is a perspective view showing the transport mechanism 127. As shown in FIGS. 5 and 6, the transport mechanism 127 includes long-sized guide rails 311, 312. As shown in FIG. 5, the guide rail 311 is fixed in the upper transport chamber 125 to be adjacent to the transport section 112 to extend in the vertical direction. The guide rail 312 is fixed in the upper transport chamber 125 to extend in the vertical direction to be adjacent to the upper transport chamber 135. In the transport mechanism 127, the z direction is defined as parallel to a direction in which the guide rails 311, 312 extend (the vertical direction).

As shown in FIGS. 5 and 6, a long-sized guide rail 313 is provided between the guide rail 311 and the guide rail 312. The guide rail 313 is attached to the guide rails 311, 312 to be movable along an axis parallel to the z direction. The guide rail 311 contains a z direction driving motor 311m (see FIG. 11, described below) for moving the guide rail 313 and a z direction encoder 311e (see FIG. 11, described below). When the z direction driving motor 311m operates, the z direction encoder 311e outputs a signal indicating an operation state (eg., rotation angle) of the z direction driving motor 311m. The output signal is supplied to the controller tc1 for transportation.

In the transport mechanism 127, the x direction is defined as parallel to a direction in which the guide rail 313 extends (a horizontal direction). Further, the y direction is defined as orthogonal to the x direction and the z direction.

A moving member 314 is attached to the guide rail 313 to be movable along an axis parallel to the x direction. The guide rail 313 contains an x direction driving motor 313m (see FIG. 11, described below) for moving the moving member 314 and an x direction encoder 313e (see FIG. 11, described below). When the x direction driving motor 313m operates, the x direction encoder 313e outputs a signal indicating an operation state (eg., rotation angle) of the x direction driving motor 313m. The output signal is supplied to the controller tc1 for transportation.

A long-sized rotation member 315 is provided on the upper surface of the moving member 314 to be rotatable around the axis parallel to the z direction. A rotation direction of the rotation member 315 with respect to the moving member 314 is referred to as a θ direction. The moving member 314 contains a θ direction driving motor 314m (see FIG. 11, described below) for rotating the rotation member 315 and a θ direction encoder 314e (see FIG. 11, described below). When the θ direction driving motor 314m operates, the θ direction encoder 314e outputs a signal indicating an operation state (e.g., rotation angle) of the θ direction driving motor 314m. The output signal is supplied to the controller tc1 for transportation.

A sensor device 316 is attached to the rotation member 315. The sensor device 316 includes an emitter holding casing 316a and a light receiver holding casing 316b.

The emitter holding casing 316a is arranged on the upper surface of the rotation member 315, and the light receiver holding casing 316b is supported by a reverse L-shaped support member 317 at an upper position spaced apart from the upper surface of the rotation member 315 for a constant distance. Hands H1, H2 are attached to the rotation member 315.

FIG. 7(a) is a plan view of the transport mechanism 127 showing the hand H1 and the rotation member 315 of FIG. 6. The light receiver holding casing 316b and the support member 317 are not shown in FIG. 7(a). FIG. 7(b) is a side view of the hands H1, H2, the moving member 314, the rotation member 315 and the sensor device 316 of FIG. 6 viewed from a predetermined position on the axis parallel to the x direction. FIG. 7(c) is a side view of the hands H1, H2, the moving member 314, the rotation member 315 and the sensor device 316 of FIG. 6 viewed from a predetermined position on the axis parallel to the y direction.

As shown in FIG. 7(a), the hand H1 is composed of a guide Ha and an arm Hb. The guide Ha is substantially C-shaped, and the arm Hb is shaped to be oblong. In the inner periphery of the guide Ha, a plurality of (three in this example) projections pr are formed inward of the guide Ha at equal angular intervals with respect to a center of a circle formed along the inner periphery of the guide Ha. A suction portion sm is provided at the tip end of each projection pr. The suction portion sm is connected to a suction system (not shown).

In the hand H1, the substrate W is placed on the three suction portions sm of the three projections pr. In this state, the suction system connected to the three suction portions sm is controlled, and three portions of the substrate W positioned on the three suction portions sm are sucked by the three suction portions sm, respectively. The hand H1 may have the four suction portions sm. In this case, four portions of the substrate W positioned on the four suction portions sm are sucked by the four suction portions sm, respectively.

As described above, the hand H1 that holds the back surface of the substrate W by suction is used as a holder. The hand H2 has the same configuration as the hand H1. In FIGS. 7(a) to 7(c), the substrate W held by the hands H1, H2 is indicated by the dashed-two dotted line.

In each hand H1, H2, a position at which a center of the held substrate W is normally positioned (hereinafter referred to as a normal position) is determined in advance. The normal position in the hand H1 is a central position of the circle formed along the inner periphery of the guide Ha, for example. The normal position in the hand H1 may be a central position of the plurality of suction portions sm.

Inside the rotation member 315, two guide rails (not shown) are provided to extend in a longitudinal direction of the rotation member 315. A rear end of the arm Hb of the hand H1 is attached to the one guide rail of the rotation member 315 by a support member 318. A rear end of the arm Hb of the hand H2 is attached to the other guide rail of the rotation member 315 by a support member 319. Thus, the hands H1, H2 are provided to be capable of advancing and retreating in the longitudinal direction of the rotation member 315, respectively.

In this example, the hand H2 is positioned above the emitter holding casing 316a. The hand H1 is positioned above the hand H2. The light receiver holding casing 316b is positioned above the hand H1.

Further, the rotation member 315 contains a driving motor xm1 for advancing and retreating an upper hand (see FIG. 11, described below) for advancing and retreating the hand H1, and an upper hand encoder xe1 (see FIG. 11, described below). When the driving motor xm1 for advancing and retreating an upper hand operates, the upper hand encoder xe1 outputs a signal indicating an operation state (e.g., rotation angle) of the driving motor xm1 for advancing and retreating an upper hand. The output signal is supplied to the controller tc1 for transportation.

Further, the rotation member 315 contains a driving motor xm2 for advancing and retreating a lower hand (see FIG. 11, described below) for advancing and retreating the hand H2, and a lower hand encoder xe2 (see FIG. 11, described below). When the driving motor xm2 for advancing and retreating a lower hand operates, the lower hand encoder xe2 outputs a signal indicating an operation state (e.g., rotation angle) of the driving motor xm2 for advancing and retreating a lower hand. The output signal is supplied to the controller tc1 for transportation.

In the rotation member 315, the x' direction is defined as the longitudinal direction of the rotation member 315, that is, a direction in which the hands H1, H2 advance and retreat, and the y' direction is defined as a direction orthogonal to the direction in which the hands H1, H2 advance and retreat.

In the following, a limit position at which the hand H1, H2 can advance and retreat in the direction in which the hands H1, H2 advance and retreat on x'y' coordinates system is referred to as an advancing/retreating reference position. In the examples of FIGS. 7(a) to 7(c), the hands H1, H2 are at the advancing/retreating reference positions, respectively. Further, in the following description, a position which is located in a direction of the arrow X' in FIG. 6 from an arbitrary position is referred to as a forward position with respect to the arbitrary position.

The emitter holding casing 316a is provided at a substantially center in the upper surface of the rotation member 315. A plurality of (four in this example) emitters 316t are held in the emitter holding casing 316a. The light receiver holding casing 316b is provided at a position above the rotation member 315 to be opposite to the emitter holding casing 316a. In the light receiver holding casing 316b, a plurality of (four in this example) light receivers 316r are held to be respectively opposite to the plurality of emitters 316t held by the emitter holding casing 316a. A detector 316D is constituted by the emitter 316t and the light receiver 316r that are opposite to each other. As shown in FIG. 7(c), the sensor device 316 includes the four detectors 316D in this example.

The four detectors 316D are arranged in a region inside of the guide Ha of the hand H1 at the advancing/retreating reference position in a horizontal plane. In this example, the four detectors 316D are arranged at constant intervals on a circular arc ar parallel to the inner periphery of the guide Ha.

Light is respectively emitted upward from the four emitters 316t. The four light receivers 316r receive the light emitted from the four emitters 316t that are respectively opposite as returning light thereby outputting light receiving signals. Each light receiving signal that has been output from each light receiver 316r is supplied to the controller tc1 for transportation.

The four emitters 316t are preferably arranged in a forward position with respect to at least the one suction portion sm of the plurality of suction portions sm of the hand H1 at the advancing/retreating reference position in the direction in which the hand H1 advances and retreats. In this case, at the time of the transportation of the substrate W by the transport mechanism 127, four portions at the outer periphery of the substrate W held by the hand H1 are reliably respectively detected by the four emitters 316t.

(4-3) Summary of the Operation of the Transport Mechanism

In the following description, xyz-coordinates of a position at which the center of the substrate W is assumed to be arranged at the time of receiving the substrate W by the hands H1, H2 are referred to as receiving coordinates. Further, xyz-coordinates of a position at which the center of the substrate W is to be arranged at the time of placing the substrate W by the hands H1, H2 are referred to as placement coordinates. The receiving coordinates and the placement coordinates are stored in advance in the memory tm of the controller tc1 for transportation of FIG. 5 as coordinates information. The coordinates information is stored in the memory tm by teaching operation by a user, for example.

The controller tc1 for transportation controls the operation of the transport mechanism 127 based on the coordinates information stored in the memory tm. Thus, the substrate W is transported among a plurality of positions spaced apart from one another.

Summary of the operation of the transport mechanism 127 will be described. FIGS. 8 (a) to 8(c) are diagrams for explaining the summary of the operation of the transport mechanism 127 of FIG. 6. One example of a case where the substrate W is transported from a first position p1 to a second position p2 by the transport mechanism 127 is shown in FIG. 8(a). In FIG. 8(a) and the subsequent FIGS. 8(b) and 8(c), the central position of the substrate W in a case where the substrate W is at the first position p1 is represented by a first central position pp1, and the central position of the substrate W in a case where the substrate W is at the second position p2 is represented by a second central position pp2.

In an initial state, coordinates of the first central position pp1 is stored in advance in the memory tm of the controller tc1 for transportation as the receiving coordinates, and coordinates of the second central position pp2 is stored in advance in the memory tm of the controller tc1 for transportation as the placement coordinates.

As shown in the upper stage of the FIG. 8(a), suppose that the substrate W is accurately arranged at the first position p1. First, the controller tc1 for transportation controls the transport mechanism 127 based on the receiving coordinates stored in the memory tm. Thus, the hand H1 is moved toward the first position p1.

Thereafter, the substrate W is received by the hand H1 as shown in the intermediate stage of the FIG. 8(a). When the substrate W is accurately arranged at the first position p1 as in this example, the center wc of the substrate W held by the hand H1 is at the normal position cp.

Thereafter, the controller tc1 for transportation controls the transport mechanism 127 based on the placement coordinates stored in the memory tm. Thus, the hand H1 that holds the substrate W is moved toward the second position p2, and the substrate W is accurately placed at the second position p2 as shown in the lower stage of FIG. 8(a). In this case, a position of the center wc of the substrate W coincides with the second central position pp2.

Another example in a case where the substrate W is transported from the first position p1 to the second position p2 by the transport mechanism 127 is shown in FIG. 8(b). As shown in the upper stage of FIG. 8(b), suppose that the substrate W is arranged at a position shifted from the first position p1 in this example. First, the controller tc1 for transportation controls the transport mechanism 127 based on the receiving coordinates stored in the memory tm. Thus, the hand H1 is moved toward the first position p1.

When the substrate W is shifted from the first position p1, the substrate W is received by the hand H1 while a position of the center wc of the substrate W is shifted from the normal position cp of the hand H1 as shown in the intermediate stage of FIG. 8(b).

Thereafter, the controller tc1 for transportation controls the transport mechanism 127 based on the placement coordinates stored in the memory tm. Thus, the hand H1 that holds the substrate W is moved toward the second position p2. In the hand H1, a position of the center wc of the substrate W is shifted from the normal position cp. In this case, the substrate W is placed at a position shifted from the second position p2, and a position of the center wc of the substrate W is shifted from the second central position pp2 as shown in the lower stage of FIG. 8(b). If the processing is performed on the substrate W in the second position p2 in this state, processing accuracy of the substrate W is reduced. Therefore, the controller tc1 for transportation controls the transport mechanism 127 as described below.

Figure 7:
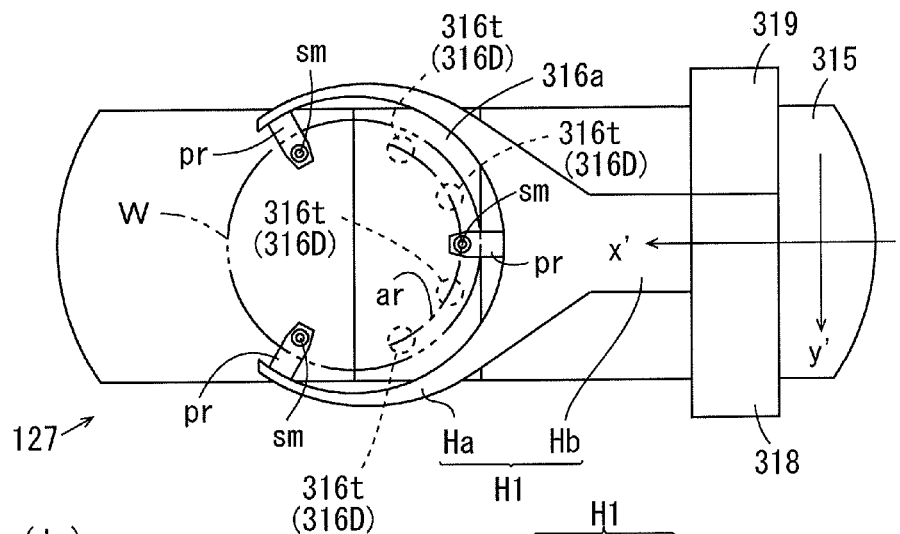
FIG. 7(a) is a plan view of the transport mechanism showing a hand and a rotation member of FIG. 6.
FIG. 7(b) is a side view of hands, a moving member, the rotation member and a sensor device of FIG. 6 viewed from a predetermined position on an axis parallel to the x direction.
FIG. 7(c) is a side view of the hands, the moving member, the rotation member and the sensor device viewed from a predetermined position on an axis parallel to the y direction.
Figure 7:
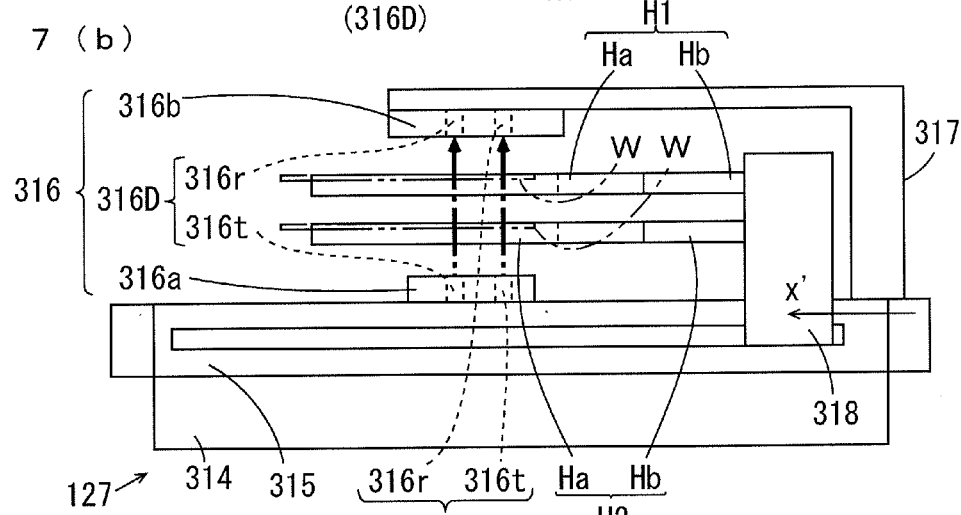
Figure 7:
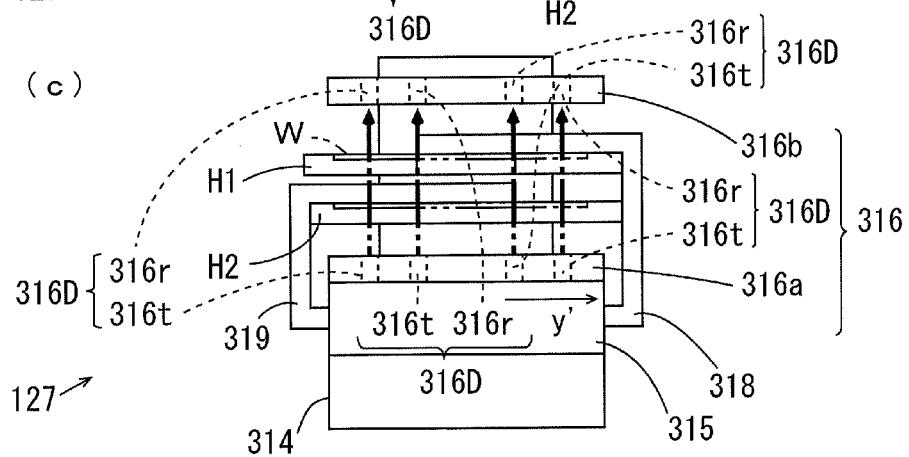

In the present embodiment, the hand H1 retreats from a forward position with respect to the sensor device 316 to the advancing/retreating reference position on the rotation member 315 of FIGS. 6 and 7 from the time when the substrate W is received until the time when the substrate W is placed by the hand H1. Thus, a plurality of portions at the outer periphery of the substrate W held by the hand H1 are respectively detected. Details of a detection method of the outer periphery of the substrate W held by the hand H1 will be described below.

The controller tc1 for transportation detects a shift of a central position of the substrate W with respect to the normal position cp of the hand H1 based on the detection result of the plurality of portions at the outer periphery of the substrate W as shown in the upper stage of FIG. 8(c). Subsequently, the controller tc1 for transportation corrects the placement coordinates based on the detected shift such that the shift between a position of the center wc of the substrate W to be placed by the hand H1 in the second position p2 and the second central position pp2 is canceled, and controls the transport mechanism 127 based on the corrected placement coordinates. Thus, the hand H1 is moved toward the second position p2, and the substrate W is accurately placed at the second position p2 as shown in FIG. 8(c). In this case, a position of the center wc of the substrate W coincides with the second central position pp2.

Thus, in the present embodiment, even if the substrate W is received by the hand H1 while the center of the substrate W is shifted from the normal position cp in the hand H1, the substrate W is accurately placed at a position to be placed at the destination.

While the transport operation of the substrate W by the hand H1 is described in the example described above, the transport operation of the substrate W by the hand H2 is similarly performed to the transport operation of the substrate W by the hand H1.

Figure 9:
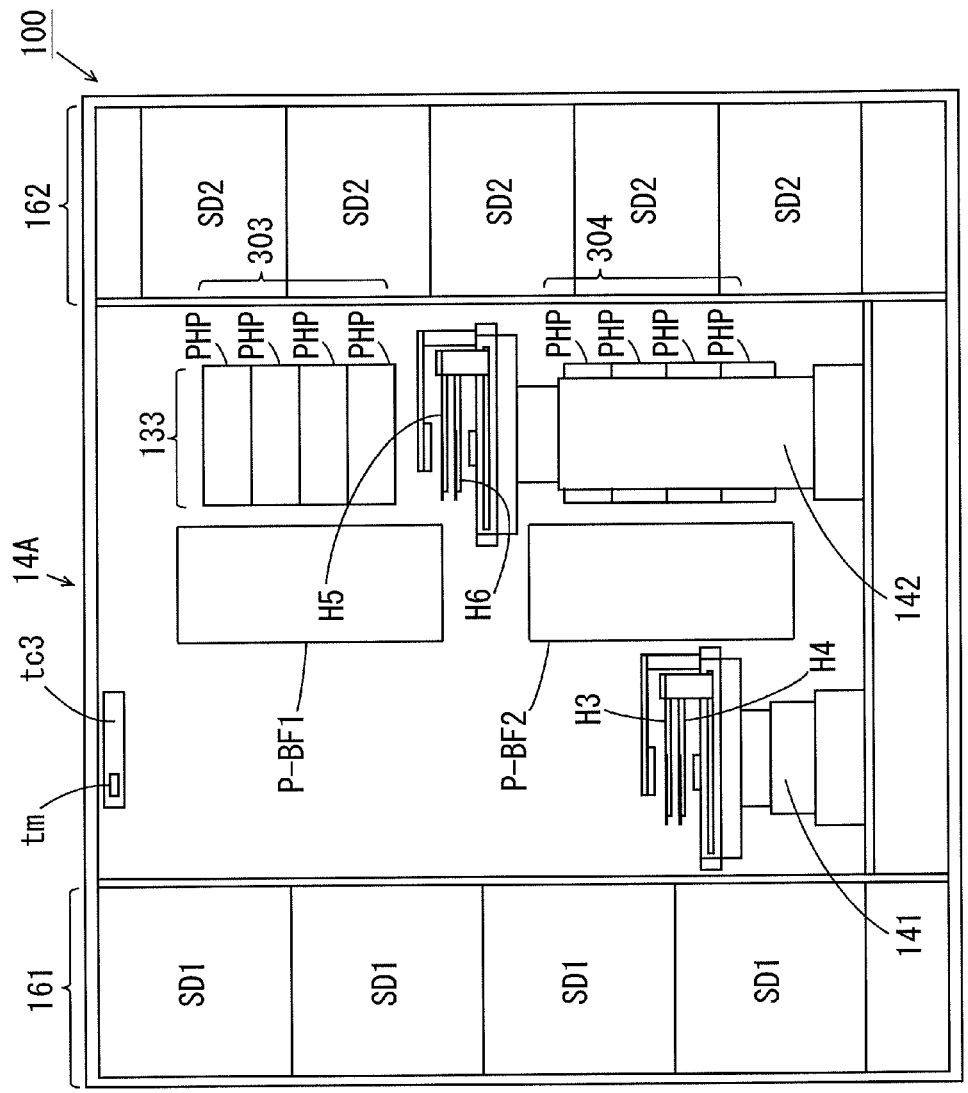
FIG. 9 is a diagram showing the inner configuration of a cleaning/drying processing block.

As shown in FIGS. 1, 5 and subsequent FIG. 9, the transport mechanisms 128, 137, 138 have the configuration and the operation similar to the transport mechanism 127. Thus, the controller tc1 for transportation of FIG. 5 controls the transport mechanism 128 similarly to the transport mechanism 127. Further, the controller tc2 for transportation of FIG. 5 controls the transport mechanisms 137, 138 similarly to the transport mechanism 127.

Further, as shown in FIGS. 1, 5 and subsequent FIG. 9, the transport mechanisms 141, 142, 146 have the configuration and the operation similar to the transport mechanism 127 except that the moving member 314 is attached to a lifting/lowering device configured to be movable in the vertical direction and the horizontal direction instead of the guide rail 313. In the transport mechanisms 141, 142, 146, the lifting/lowering device contains the z direction driving motor 311m (see FIG. 11, described below), the z direction encoder 311e (see FIG. 11, described below), the x direction driving motor 313m (see FIG. 11, described below) and the x direction encoder 313e (see FIG. 11, described below). The controller tc3 for transportation of FIG. 5 controls the transport mechanisms 141, 142 similarly to the transport mechanism 127. The controller tc4 for transportation of FIG. 5 controls the transport mechanism 146 similarly to the transport mechanism 127.

(5) Configuration of the Cleaning/Drying Processing Block

FIG. 9 is a diagram showing the inner configuration of the cleaning/drying processing block 14A. Note that, FIG. 9 is a diagram of the cleaning/drying processing block 14A viewed from the exposure device 15 of FIG. 1.

As shown in FIG. 9, the transport mechanism 141 has hands H3, H4 for holding the substrate W, the transport mechanism 142 has hands H5, H6 for holding the substrate W.

The cleaning/drying processing units SD1 are provided in a stack on the +Y side of the transport mechanism 141, and the cleaning/drying processing units SD2 are provided in a stack on the −Y side of the transport mechanism 142. The placement/buffer sections P-BF1, P-BF2 are provided one above the other on the −X side between the transport mechanisms 141, 142.

Further, the thermal processing units PHP in the upper thermal processing section 303 and the lower thermal processing section 304 are configured such that the substrates W can be carried in from the cleaning/drying processing block 14A.

(6) Operation of Each Constituent Element of the Substrate Processing Apparatus

The operation of each constituent element of the substrate processing apparatus 100 according to the present embodiment will be described below.

(6-1) Operation of the Indexer Block 11

The operation of the indexer block 11 will be described below mainly using FIGS. 1 and 5. In the substrate processing apparatus 100 according to the present embodiment, each carrier 113 in which the unprocessed substrates W are stored is first placed on each carrier platform 111 in the indexer block 11. The transport mechanism 115 takes out the one substrate W from the carrier 113, and transports the substrate W to the substrate platform PASS1. Thereafter, the transport mechanism 115 takes out another unprocessed substrate W from the carrier 113, and transports the substrate W to the substrate platform PASS3 (FIG. 5).

When the processed substrate W is placed on the substrate platform PASS2 (FIG. 5), the transport mechanism 115 takes out the processed substrate W from the substrate platform PASS2 after transporting the unprocessed substrate W to the substrate platform PASS1. Then, the transport mechanism 115 transports the processed substrate W to the carrier 113. Similarly, when the processed substrate W is placed on the substrate platform PASS4, the transport mechanism 115 takes out the processed substrate W from the substrate platform PASS4 after transporting the unprocessed substrate W to the substrate platform PASS3. Then, the transport mechanism 115 transports the processed substrate W to the carrier 113 and stores the same in the carrier 113.

(6-2) Operation of the First Processing Block 12

The operation of the first processing block 12 will be described mainly using FIGS. 1, 3 and 5. In the following, the movement of the transport mechanisms 127, 128 in the X direction and the Z direction is not described for simplification.

The substrate W placed on the substrate platform PASS1 (FIG. 5) by the transport mechanism 115 (FIG. 5) is taken out by the hand H1 of the transport mechanism 127 (FIG. 5). Further, the transport mechanism 127 places the substrate W held by the hand H2 on the substrate platform PASS2. The substrate W placed on the substrate platform PASS2 by the hand H2 is the substrate W after the development processing.

Next, the transport mechanism 127 takes out the substrate W after the adhesion reinforcement processing from the predetermined adhesion reinforcement processing unit PAHP (FIG. 3) in the upper thermal processing unit 301 (FIG. 3) using the hand H2. Further, the transport mechanism 127 carries in the unprocessed substrate W held by the hand H1 to the adhesion reinforcement processing unit PAHP.

Next, the transport mechanism 127 takes out the substrate W after the cooling processing from the predetermined cooling unit CP in the upper thermal processing section 301 (FIG. 3) using the hand H1. Further, the transport mechanism 127 carries in the substrate W after the adhesion reinforcement processing held by the hand H2 to the cooling unit CP. In the cooling unit CP, the substrate W is cooled to a temperature suitable for anti-reflection film formation.

Next, the transport mechanism 127 takes out the substrate W after the anti-reflection film formation placed on the spin chuck 25 (FIG. 2) in the coating processing chamber 22 (FIG. 2) using the hand H2. Further, the transport mechanism 127 places the substrate W after the cooling processing held by the hand H1 on the spin chuck 25. In the coating processing chamber 22, the anti-reflection film is formed on the substrate W by the coating processing unit 129 (FIG. 2).

Next, the transport mechanism 127 takes out the substrate W after the thermal processing from the predetermined thermal processing unit PHP in the upper thermal processing section 301 (FIG. 3) using the hand H1. Further, the transport mechanism 127 carries in the substrate W after the anti-reflection film formation held by the hand H2 to the thermal processing unit PHP. In the thermal processing unit PHP, the heating processing and the cooling processing for the substrate W are successively performed.

Then, the transport mechanism 127 takes out the substrate W after the cooling processing from the predetermined cooling unit CP (FIG. 3) in the upper thermal processing section 301 (FIG. 4) using the hand H2. Further, the transport mechanism 127 carries in the substrate W after the thermal processing held by the hand H1 to the cooling unit CP. In the cooling unit CP, the substrate W is cooled to a temperature suitable for resist film formation processing.

Next, the transport mechanism 127 takes out the substrate W after the resist film formation from the spin chuck 25 (FIG. 2) in the coating processing chamber 21 (FIG. 2) using the hand H1. Further, the transport mechanism 127 places the substrate W after the cooling processing held by the hand H2 on the spin chuck 25. In the coating processing chamber 22, the resist film is formed on the substrate W by the coating processing unit 129 (FIG. 2).

Next, the transport mechanism 127 takes out the substrate W after the thermal processing from the predetermined thermal processing unit PHP in the upper thermal processing section 301 (FIG. 3) using the H2. Further, the transport mechanism 127 carries in the substrate W after the resist film formation held by the hand H1 to the thermal processing unit PHP.

Next, the transport mechanism 127 places the substrate W after the thermal processing held by the hand H2 on the substrate platform PASS5 (FIG. 5). Further, the transport mechanism 127 takes out the substrate W after the development processing from the substrate platform PASS6 (FIG. 5) using the hand H2. Thereafter, the transport mechanism 127 transports the substrate W after the development processing that has been taken out from the substrate platform PASS6 to the substrate platform PASS2 (FIG. 5).

The transport mechanism 127 repeats the processing described above, whereby the predetermined processing is successively performed on the plurality of substrates W in the first processing block 12.

The transport mechanism 128 carries in and carries out the substrates W to/from the substrate platforms PASS3, PASS4, PASS7, PASS8 (FIG. 5), the coating processing chambers 23, 24 (FIG. 2) and the lower thermal processing section 302 (FIG. 4) by performing the similar operation to the transport mechanism 127.

In the present embodiment, the processing for the plurality of substrates W can be simultaneously performed in an upper processing section (the coating processing chambers 21, 22 and the upper thermal processing section 301) and a lower processing section (the coating processing chambers 23, 24 and the lower thermal processing section 302). Thus, throughput of the first processing block 12 can be improved without increasing a transfer speed of the substrate W by the transport mechanisms 127, 128.

While the cooling processing for the substrate W is performed in the cooling unit CP before the formation processing of the anti-reflection film in the coating processing chamber 22 in the example described above, the cooling processing for the substrate W does not have to be performed in the cooling unit CP before the formation processing of the anti-reflection film if the anti-reflection film can be appropriately formed.

(6-3) Operation of the Second Processing Block 13

The operation of the second processing block 13 will be described below mainly using FIGS. 1 to 3 and FIG. 5. In the following, the movement of the transport mechanisms 137, 138 in the X direction and the Z direction is not be described for simplification.

The substrate W placed on the substrate platform PASS5 (FIG. 5) by the transport mechanism 127 is taken out by the hand H1 of the transport mechanism 137 (FIG. 5). Further, the transport mechanism 137 places the substrate W held by the hand H2 on the substrate platform PASS6. The substrate W placed on the substrate platform PASS6 from the hand H2 is the substrate W after the development processing.

Next, the transport mechanism 137 takes out the substrate W after resist cover film formation from the spin chuck 25 (FIG. 2) in the coating processing chamber 32 (FIG. 2) using the hand H2. Further, the transport mechanism 137 places the substrate W after the resist film formation held by the hand H1 on the spin chuck 25. In the coating processing chamber 32, the resist cover film is formed on the substrate W by the coating processing unit 129 (FIG. 2).

Next, the transport mechanism 137 takes out the substrate W after the thermal processing from the predetermined thermal processing unit PHP in the upper thermal processing section 303 (FIG. 3) using the hand H1. Further, the transport mechanism 137 carries in the substrate W after the resist cover film formation held by the hand H2 to the thermal processing unit PHP.

Then, the transport mechanism 137 takes out the substrate W after the edge exposure processing from the edge exposure unit EEW (FIG. 3) using the hand H2. Further, the transport mechanism 137 carries in the substrate W after the thermal processing held by the hand H1 to the edge exposure unit EEW. In the edge exposure unit EEW, the edge exposure processing for the substrate W is performed.

The transport mechanism 137 places the substrate W after the edge exposure processing held by the hand H2 on the placement/buffer section P-BF1 (FIG. 5), and takes out the substrate W after the thermal processing from the thermal processing unit PHP in the upper thermal processing section 303 (FIG. 3) adjacent to the cleaning/drying processing block 14A using the hand H2. The substrate W taken out from the thermal processing unit PHP adjacent to the cleaning/drying processing block 14A is the substrate W on which the exposure processing in the exposure device 15 is completed.

Next, the transport mechanism 137 takes out the substrate W after the cooling processing from the predetermined cooling unit CP (FIG. 3) in the upper thermal processing section 303 (FIG. 3) using the hand H1. Further, the transport mechanism 137 carries in the substrate W after the exposure processing held by the hand H2 to the cooling unit CP. In the cooling unit CP, the substrate W is cooled to a temperature suitable for the development processing.

Then, the transport mechanism 137 takes out the substrate W after the development processing from the spin chuck 35 (FIG. 2) in the development processing chamber 31 (FIG. 2) using the hand H2. Further, the transport mechanism 137 places the substrate W after the cooling processing held by the hand H1 on the spin chuck 35. In the development processing chamber 31, removal processing of the resist cover film and the development processing are performed by the development processing unit 139.

Next, the transport mechanism 137 takes out the substrate W after the thermal processing from the predetermined thermal processing unit PHP in the upper thermal processing section 303 (FIG. 4) using the hand H1. Further, the transport mechanism 137 carries in the substrate W after the development processing held by the hand H2 to the thermal processing unit PHP. Thereafter, the transport mechanism 137 places the substrate W, which the transport mechanism 137 has taken out from the thermal processing unit PHP, on the substrate platform PASS6 (FIG. 5).

The transport mechanism 137 repeats the processing described above, whereby the predetermined processing is successively performed on the plurality of substrates W in the second processing block 13.

Similarly to the operation of the transport mechanism 137, the transport mechanism 138 carries in and carries out the substrates W to/from the substrate platforms PASS7, PASS8, P-BF2 (FIG. 5), the development processing chamber 33 (FIG. 2), the coating processing chamber 34 (FIG. 2) and the lower thermal processing section 304 (FIG. 3).

In the present embodiment, the processing for the plurality of substrates W can be simultaneously performed in an upper processing section (the development processing chamber 31, the coating processing chamber 32 and the upper thermal processing section 303) and a lower processing section (the development processing chamber 33, the coating processing chamber 34 and the lower thermal processing section 304). Thus, throughput of the second processing block 13 can be improved without increasing a transportation speed of the substrate W by the transport mechanisms 137, 138.

(6-4) Operation of the Cleaning/Drying Processing Block 14A and the Carry-in/Carry-Out Block 14B The operation of the cleaning/drying processing block 14A and the carry-in/carry-out block 14B will be described below mainly using FIGS. 5 and 9.

In the cleaning/drying processing block 14A, the transport mechanism 141 (FIG. 9) takes out the substrate W after the edge exposure placed on the placement/buffer section P-BF1 by the transport mechanism 137 (FIG. 5) using the hand H3.

Next, the transport mechanism 141 takes out the substrate W after the cleaning and drying processing from the predetermined cleaning/drying processing unit SD1 in the cleaning/drying processing section 161 (FIG. 9) using the hand H4. Further, the transport mechanism 141 carries in the substrate W after the edge exposure held by the hand H3 to the cleaning/drying processing unit SD1.

Then, the transport mechanism 141 places the substrate W after the cleaning and drying processing held by the hand H4 on the placement/cooling unit P-CP (FIG. 5). In the placement/cooling unit P-CP, the substrate W is cooled to a temperature suitable for the exposure processing in the exposure device 15 (FIG. 1).

Next, the transport mechanism 141 takes out the substrate W after the edge exposure placed on the placement/buffer section P-BF2 by the transport mechanism 138 (FIG. 5) using the hand H3. Next, the transport mechanism 141 takes out the substrate W after the cleaning and drying processing from the predetermined cleaning/drying processing unit SD1 in the cleaning/drying processing section 161 (FIG. 9) using the hand H4. Further, the transport mechanism 141 carries in the substrate W after the edge exposure held by the hand H3 to the cleaning/drying processing unit SD1. Then, the transport mechanism 141 places the substrate W after the cleaning and drying processing held by the hand H4 on the placement/cooling unit P-CP (FIG. 5).

Thus, the transport mechanism 141 alternately takes out the substrates W after the edge exposure from the placement/buffer sections P-BF1, P-BF2, and transports the substrates W to the placement/cooling units P-CP via the cleaning/drying processing section 161.

The transport mechanism 142 (FIG. 9) takes out the substrate W after the exposure processing placed on the substrate platform PASS9 (FIG. 5) using the hand H5. Then, the transport mechanism 142 takes out the substrate W after the cleaning and drying processing from the predetermined cleaning/drying processing unit SD2 in the cleaning/drying processing section 162 (FIG. 9) using the hand H6. Further, the transport mechanism 142 carries in the substrate W after the exposure processing held by the hand H5 to the cleaning/drying processing unit SD2.

Then, the transport mechanism 142 transports the substrate W after the cleaning and drying processing held by the hand H6 to the thermal processing unit PHP (FIG. 9) in the upper thermal processing section 303. In this thermal processing unit PHP, post-exposure bake (PEB) processing is performed.

Next, the transport mechanism 142 (FIG. 9) takes out the substrate W after the exposure processing placed on the substrate platform PASS9 (FIG. 5) using the hand H5. Then, the transport mechanism 142 takes out the substrate W after the cleaning and drying processing from the predetermined cleaning/drying processing unit SD2 in the cleaning/drying processing section 162 (FIG. 9) using the hand H6. Further, the transport mechanism 142 carries in the substrate W after the exposure processing held by the hand H5 to the cleaning/drying processing unit SD2.

Then, the transport mechanism 142 transports the substrate W after the cleaning and drying processing held by the hand H6 to the thermal processing unit PHP (FIG. 9) in the lower thermal processing section 304. In this thermal processing unit PHP, the PEB processing is performed.

Thus, the transport mechanism 142 alternately transports the substrates W after the exposure processing placed on the substrate platform PASS9 to the upper thermal processing section 303 and the lower thermal processing section 304 via the cleaning/drying processing section 162.

In the carry-in/carry-out block 14B, the transport mechanism 146 (FIG. 5) takes out the substrate W placed on the placement/cooling unit P-CP and transports the same to the substrate carry-in section 15*a* of the exposure device 15 using the hand H7. Further, the transport mechanism 146 takes out the substrate W after the exposure processing from the substrate outlet 15*b* of the exposure device 15 and transports the same to the substrate platform PASS9 using the hand H8.

When the exposure device 15 cannot receive the substrates W, the substrates W after the cleaning and drying processing are temporarily stored in the placement/buffer sections P-BF1, P-BF2 by the transport mechanism 141 (FIG. 7).

Further, when the development processing unit 139 (FIG. 2) in the second processing block 13 cannot receive the substrates W after the exposure processing, the substrates W after the PEB processing are temporarily stored in the placement/buffer sections P-BF1, P-BF2 by the transport mechanisms 137, 138 (FIG. 5).

Further, when the substrates W are not normally transported to the placement/buffer sections P-BF1, P-BF2 due to malfunction or the like of the first and second processing blocks 12, 13, transportation of the substrates W from the placement/buffer sections P-BF1, P-BF2 by the transport mechanism 141 may be temporarily stopped until the transportation of the substrates W is normalized.

(7) Detection Method of the Outer Periphery of the Substrate and Correction Method of the Placement Coordinates The plurality of support members m of FIG. 1, the plurality of spin chucks 25, 35 of FIG. 2, the spin chuck 98 of FIG. 3, the spin chuck of the cleaning/drying processing unit SD1 of FIG. 2, the spin chuck of the cleaning/drying processing unit SD2 of FIG. 3 and a support member of the placement/cooling unit P-CP of FIG. 5 will, hereinafter, be collectively termed supporters.

As described above, at the time of the transportation of the substrate W, the hand H1 retreats on the rotation member 315 from a forward position with respect to the sensor device 316 to the advancing/retreating reference position from the time when the substrate W is received by the hand H1 until the time when the substrate W held by the hand H1 is placed on the supporter, for example. A plurality of portions at the outer periphery of the substrate W being moved by the hand H1 are detected by the sensor device 316 of FIGS. 6 and 7 while the hand H1 is moved to the advancing/retreating reference position.

Figure 10:
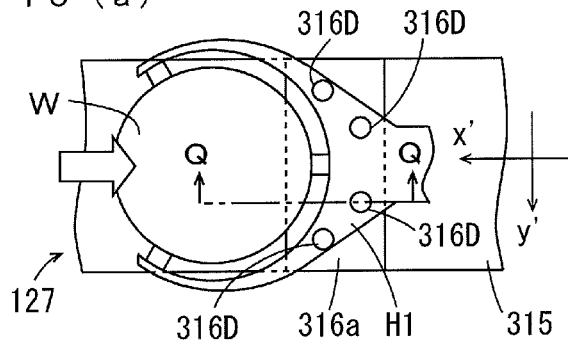
FIGS. 10(a) to 10(h) are diagrams for explaining a detection method of a plurality of portions at an outer periphery of the substrate by the sensor device of FIGS. 6 and 7.
Figure 10:
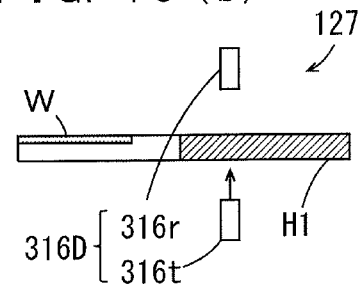
Figure 10:
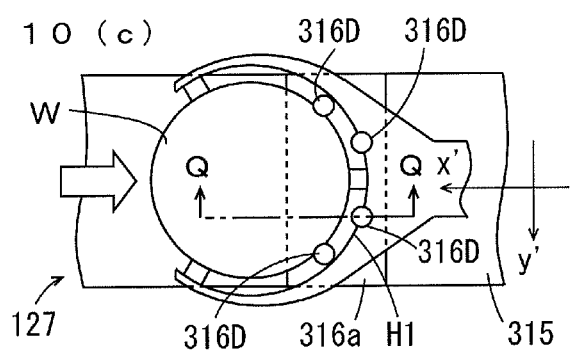
Figure 10:
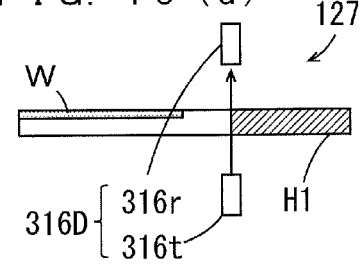
Figure 10:
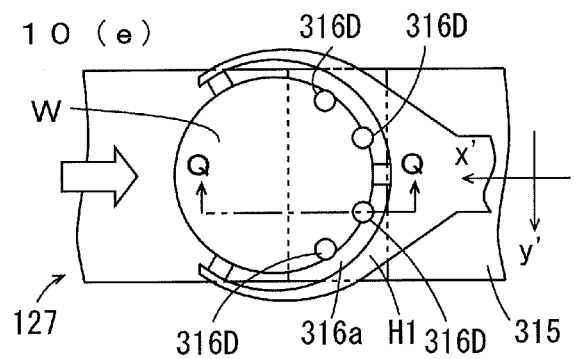
Figure 10:
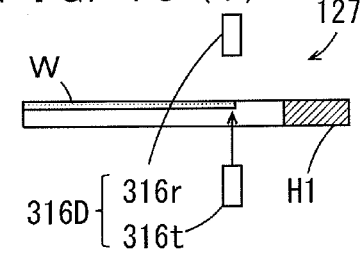
Figure 10:
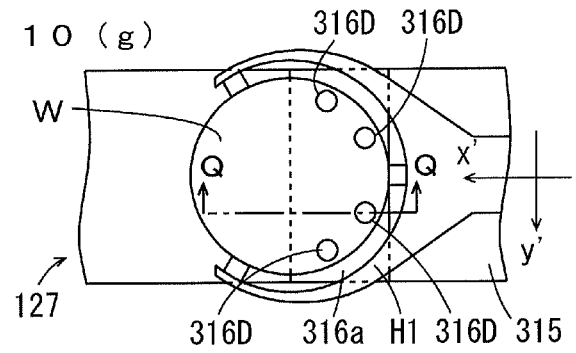
Figure 10:
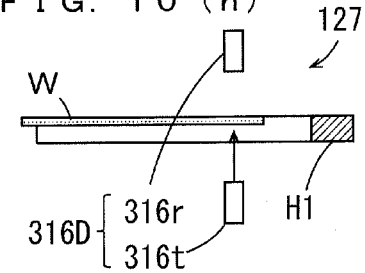

FIG. 10 is a diagram for explaining the detection method of the plurality of portions at the outer periphery of the substrate W by the sensor device 316 of FIGS. 6 and 7. FIGS. 10(*a*), 10(*c*), 10(*e*), 10(*g*) show changes in the states of the hand H1, the rotation member 315 and the plurality of detectors 316D when the hand H1 retreats toward the advancing/retreating reference position. FIGS. 10(*b*), 10(*d*), 10(*f*), 10(*h*) show schematic cross sectional views taken along the line Q-Q of FIGS. 10(*a*), 10(*c*), 10(*e*), 10(*g*), respectively. Description will not be made of the hand H2.

First, the hand H1 is positioned in a forward position with respect to the four detectors 316D at a time point at which the substrate W is received by the hand H1. In this case, the hand H1 is not positioned between the four emitters 316*t* and the four light receivers 316*r*. Therefore, the four light receivers 316*r* receive the light from the four emitters 316*t* respectively opposite. Thus, the light receiving signals are supplied to the controller tc1 for transportation.

Next, the hand H1 retreats. In this case, as shown in FIGS. 10(*a*), 10(*b*), the hand H1 enters a space between the four emitters 316*t* and the four light receivers 316*r*. At this time, because the light emitted from the four emitters 316*t* is shielded by the hand H1, the four light receivers 316*r* do not receive the light from the four emitters 316*t* respectively opposite. Therefore, the light receiving signals are not supplied to the controller tc1 for transportation.

Then, as shown in FIGS. 10(c), 10(d), the hand H1 passes through the space between the four emitters 316t and the four light receivers 316r. At a time point at which the hand H1 passes through a space between each emitter 316t and the opposite light receiver 316r, each light receiver 316r receives the light from the opposite emitter 316t. Thus, the light receiving signals are supplied to the controller tc1 for transportation.

Next, as shown in FIGS. 10(e), 10(f), the substrate W held by the hand H1 enters the space between the four emitters 316t and the four light receivers 316r. At a time point at which the outer periphery of the substrate W held by the hand H1 enters the space between each emitter 316t and the light receiver 316r opposite to the emitter 316t, the light emitted from each emitter 316t is shielded by the outer periphery of the substrate W. In this case, each light receiver 316r does not receive the light from the opposite emitter 316t. Therefore, the light receiving signals are not supplied to the controller tc1 for transportation.

Next, as shown in FIGS. 10(g), 10(h), the hand H1 is stopped at the advancing/retreating reference position. At this time, the substrate W held by the hand H1 is positioned in the space between the four emitters 316t and the four light receivers 316r. In this case, the four light receivers 316r do not receive the light from the four emitters 316t respectively opposite. Therefore, the light receiving signals are not supplied to the controller tc1 for transportation.

As described above, the light receiving signals are respectively intermittently supplied from the four light receivers 316r of the four detectors 316D to the controller tc1 for transportation from the time when the substrate W is received by the hand H1 until the time when the hand H1 is moved to the advancing/retreating reference position.

The controller tc1 for transportation obtains a signal output from the upper hand encoder xe1 (see FIG. 11, described below) at a time point at which supply of the light receiving signal from each of the four light receivers 316r (the time points of FIGS. 10(e) and 10(f)) is stopped because of the outer periphery of the substrate W. Thus, the controller tc1 for transportation stores the operation state (e.g., rotation angle) of the driving motor xm1 for advancing and retreating an upper hand as the detection result of the four portions at the outer periphery of the substrate W.

Here, the detection result, of the four portions at the outer periphery of the substrate W that is obtained when the hand H1 that holds the substrate W is moved to the advancing/retreating reference position from a forward position with respect to the sensor device 316 while the center wc of the substrate W (FIG. 8) is at the normal position cp (FIG. 8) of the hand H1, is stored in advance as a normal data in the memory tm of the controller tc1 for transportation.

The sensor device 316 is fixed to the rotation member 315. Therefore, positions of the plurality of detectors 316D of the sensor device 316 on the x'y' coordinates system do not change. The controller tc1 for transportation calculates the x'y' coordinates that indicate positions of four portions at the outer periphery of the substrate W when the hand H1 is at the advancing/retreating reference position, for example, based on the difference between the detection result of the four portions at the outer periphery of the substrate W and the detection result of the normal data of the four portions. X'y' coordinates of a position of the center wc of the substrate W when the hand H1 is at the advancing/retreating reference position is calculated based on the calculated x'y' coordinates of the positions of the four portions.

X'y' coordinates of a position of the center wc of the substrate W in the hand H1 can be calculated based on the x'y' coordinates of the three portions at the outer periphery of the substrate W. In this example, the x'y' coordinates of the four portions at the outer periphery of the substrate W are obtained. Thus, even if one of the four portions is a cutout (an orientation flat or a notch) for positioning the substrate W, for example, the x'y' coordinates of the position of the center wc of the substrate W can be calculated based on the x'y' coordinates of the three portions except for the x'y' coordinates of the cutout. When an outer diameter of the substrate W is known, the x'y' coordinates of the position of the center wc of the substrate W can be calculated based on the x'y' coordinates of the two portions at the outer periphery of the substrate W. In this case, the sensor device 316 may be constituted by the two or three detectors 316D.

The controller tc1 for transportation detects a shift in the position of the center wc of the substrate W with respect to the normal position cp when the hand H1 is at the advancing/retreating reference position based on the value of the calculated x'y' coordinates after the controller tc1 for transportation calculates the x'y' coordinates of the position of the center wc of the substrate W when the hand H1 is at the advancing/retreating reference position. Then, the controller tc1 for transportation corrects the placement coordinates based on the detected shift such that a shift between a position of the center wc of the substrate W to be placed in the supporter at the destination by the hand H1 and a predetermined position on the supporter is canceled.

Figure 11:
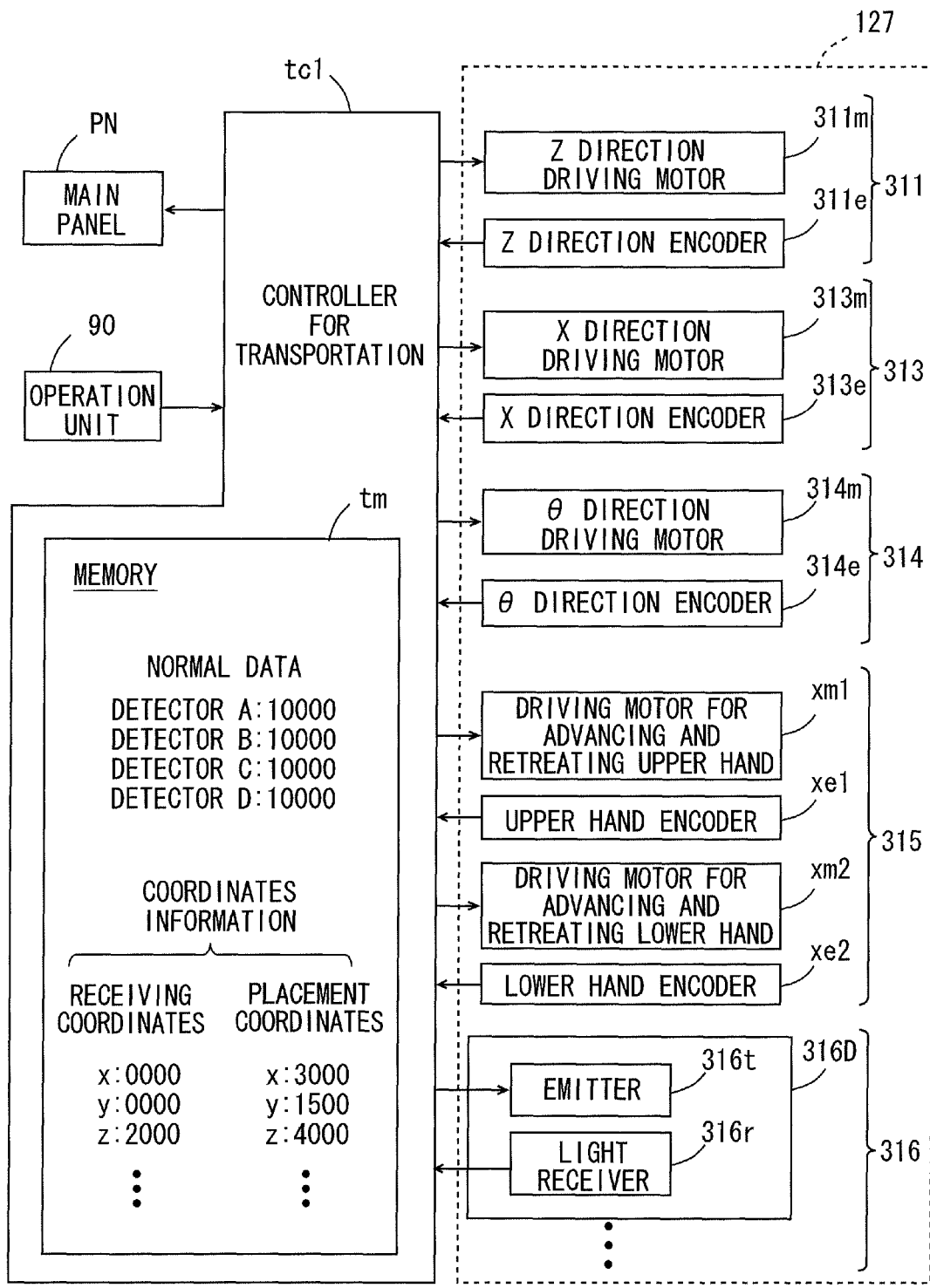
FIG. 11 is a block diagram mainly showing the relationship between each constituent element of the transport mechanism and a controller for transportation of FIG. 5.

(8) Relationship Between the Transport Mechanism and the Controller for Transportation FIG. 11 is a block diagram showing the relationship between each constituent element of the transport mechanism 127 and the controller tc1 for transportation of FIG. 5.

As shown in FIG. 11, the operation unit 90, the main panel PN, the z direction driving motor 311m, the z direction encoder 311e, the x direction driving motor 313m, the x direction encoder 313e, the θ direction driving motor 314m, the θ direction encoder 314e, the driving motor xm1 for advancing and retreating an upper hand, the upper hand encoder xe1, the driving motor xm2 for advancing and retreating a lower hand, the lower hand encoder xe2 and the plurality of detectors 316D are connected to the controller tc1 for transportation.

The controller tc1 for transportation contains the memory tm. The normal data and the coordinates information (the receiving coordinates and the placement coordinates), described above, are stored in the memory tm.

The operation of the main panel PN, the z direction driving motor 311m, the x direction driving motor 313m, the θ direction driving motor 314m, the driving motor xm1 for advancing and retreating an upper hand, the driving motor xm2 for advancing and retreating a lower hand and the emitters 316t of each detector 316D are controlled by the controller tc1 for transportation.

Further, various types of signals are supplied to the controller tc1 for transportation from the z direction encoder 311e, the x direction encoder 313e, the θ direction encoder 314e, the upper hand encoder xe1, the lower hand encoder xe2 and the light receivers 316r of each detector 316D. Further, operation information of the operation unit 90 by a user is supplied to the controller tc1 for transportation. For example, the user can store the normal data and the coordinates information in the memory tm of the controller tc1 for transportation by operating the operating unit 90.

The relationship between each constituent element of the transport mechanism 128 of FIG. 5 and the controller tc1 for transportation of FIG. 5, the relationship between each constituent element of the transport mechanisms 137, 138 of FIG. 5 and the controller tc2 for transportation of FIG. 5, the relationship between each constituent element of the transport mechanisms 141, 142 of FIG. 1 and the controller tc3 for transportation of FIG. 5 and the relationship between each constituent element of the transport mechanism 146 of FIG. 5 and the controller tc4 for transportation of FIG. 5 are the same as the relationship between each constituent element of the transport mechanism 127 and the controller tc1 for transportation respectively shown in FIG. 11.

(9) One Example of the Control of the Transport Mechanism

In the transport mechanism 127, the outer periphery of the substrate W held by the hand H1 is detected by the sensor device 316. Further, the outer periphery of the substrate W held by the hand H2 is detected by the sensor device 316.

Figure 12:
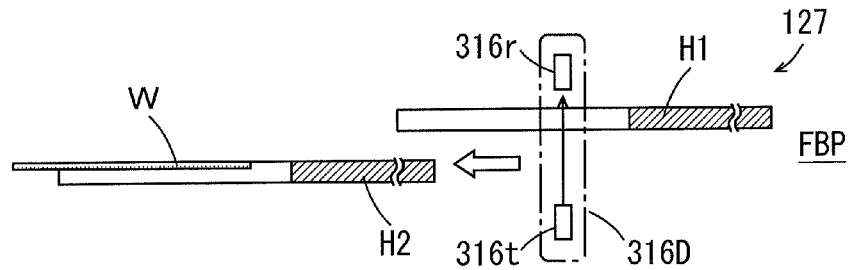
FIGS. 12(a) to 12(e) are diagrams showing one example of control of the transport mechanism for detecting outer peripheries of the two substrates held by the two hands by the one sensor device.
Figure 12:
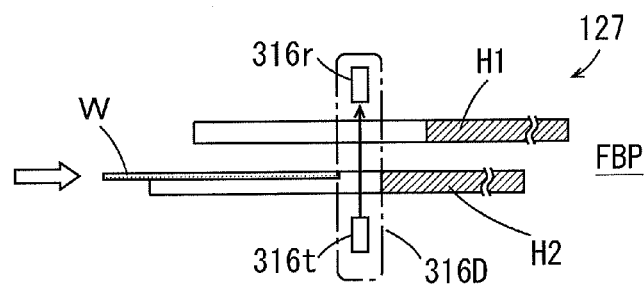
Figure 12:
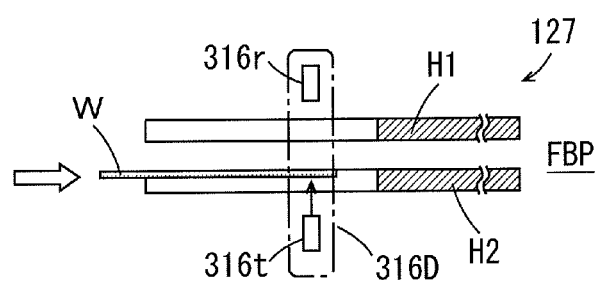
Figure 12:
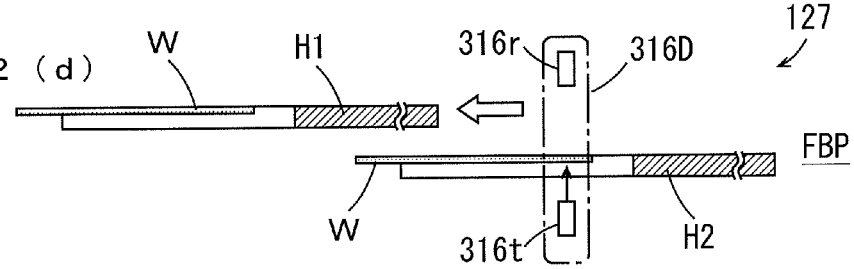
Figure 12:
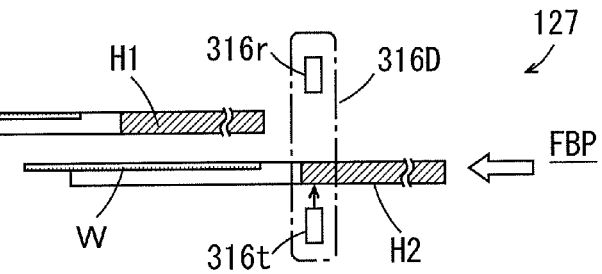
Figure 13:
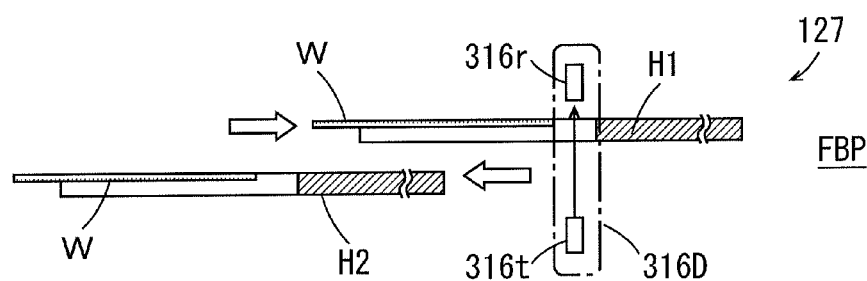
FIGS. 13(a) to 13(c) are diagrams showing one example of control of the transport mechanism for detecting the outer peripheries of the two substrates held by the two hands by the one sensor device.
Figure 13:
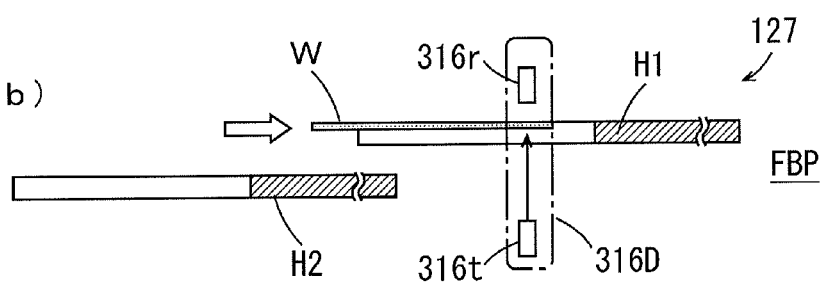
Figure 13:
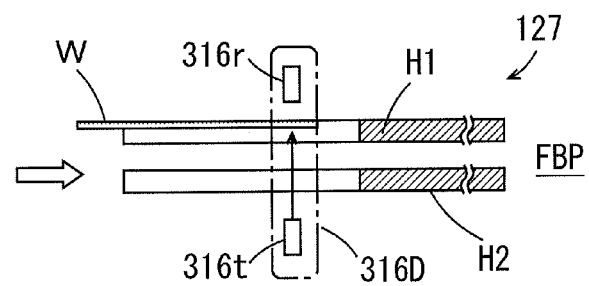

FIGS. 12 and 13 are diagrams showing one example of the control of the transport mechanism 127 for detecting the outer peripheries of the two substrates W held by the two hands H1, H2 by the one sensor device 316. In FIGS. 12(a) to 12(e) and FIGS. 13(a) to 13(c), positional relationship of the hands H1, H2 and the one detector 316D are shown in the vertical cross sectional view.

In the initial state, the substrates W are not held by the hands H1, H2. Further, the hands H1, H2 are at the advancing/retreating reference position FBP. In this case, the light receivers 316r receive the light emitted from the emitters 316t and passing through the inside of the guide Ha (see FIGS. 7(a), 7(b)) of the hands H1, H2.

As shown in FIG. 12(a), the lower hand H2 first advances from the advancing/retreating reference position FBP to the forward position with respect to the detector 316D and receives the substrate W arranged at a predetermined position. At this time, the light receivers 316r receive the light emitted from the emitters 316t.

Next, the hand H2 that holds the substrate W retreats toward the advancing/retreating reference position FBP. In this case, as shown in FIG. 12(b), the light receivers 316r receive the light, emitted from the emitters 316t and passing through a space between the outer periphery of the substrate W and the hand H2, by the time the hand H2 is moved to the advancing/retreating reference position FBP. Thereafter, when the hand H2 reaches the advancing/retreating reference position FBP, the substrate W held by the hand H2 is positioned between the emitters 316t and the light receivers 316r. Thus, as shown in FIG. 12(c), the light receivers 316r do not receive the light from the corresponding emitters 316t.

The hand H2 is moved as described above. Thus, a plurality of portions at the outer periphery of the substrate W held by the hand H2 are detected based on the light receiving signals output from the light receivers 316r.

Next, as shown in FIG. 12(d), the upper hand H1 advances from the advancing/retreating reference position FBP to the forward position with respect to the detector 316D and receives the substrate W arranged at a predetermined position. At this time, the light emitted from the emitters 316t is shielded by the substrate W held by the hand H2. Therefore, the light receivers 316r do not receive the light emitted from the emitters 316t.

Then, as shown in FIG. 12(e), the hand H1 that holds the substrate W retreats toward the advancing/retreating reference position FBP, and the hand H2 that holds the substrate W advances from the advancing/retreating reference position FBP. Thereafter, as shown in FIG. 13(a), the hand H2 is moved to the forward position with respect to the emitters 316t and the light receivers 316r. Thus, the light receivers 316r receive the light emitted from the emitters 316t and passing through the space between the outer periphery of the substrate W and the hand H2, by the time the hand H1 is moved to the advancing/retreating reference position FBP.

When the hand H1 is moved to the advancing/retreating reference position FBP, the substrate W held by the hand H1 is positioned between the emitters 316t and the light receivers 316r. Thus, the light receivers 316r do not receive the light from the corresponding emitters 316t as shown in FIG. 13(b).

The hands H1, H2 are moved as described above. Thus, the plurality of portions at the outer periphery of the substrate W held by the hand H1 are detected based on the light receiving signals output from the light receivers 316r.

Thereafter, as shown in FIG. 13(c), the hand H2 retreats to the advancing/retreating reference position FBP after the substrate W held by the advancing hand H2 is placed on the supporter.

As described above, in the present embodiment, the hands H1, H2 advance and retreat in opposite directions from each other such that the plurality of portions at the outer peripheries of the two substrates W held by the two hands H1, H2 can be detected by the one sensor device 316.

(10) Effects of the Embodiment (10-1) In the substrate processing apparatus 100 according to the present embodiment, the coordinates information for transporting the substrates W between a plurality of positions are stored in advance in each of the memories tm of the plurality of controllers tc1 to tc4 for transporting. Further, detection result of four portions at the outer periphery of the substrate W when the center wc of the substrate W is at the normal position cp of a hand is stored in advance in each memory tm as the normal data.

In the transportation mechanism controlled by each controller for transportation, a plurality of portions at the outer periphery of the substrate W being moved by a hand are respectively detected before the substrate W is placed on the supporter by the hand.

Each controller for transportation corrects the placement coordinates based on the detection result of the plurality of portions at the outer periphery of the substrate W, the placement coordinate and the normal data such that a shift between a position of the substrate W to be placed in the supporter at the destination by the hand and a predetermined position on the supporter is canceled. Each controller for transportation controls the transport mechanism based on the corrected placement coordinates.

Thus, even if a position of the substrate W held by the hand is shifted from the normal position, the substrate W held by the hand can be accurately placed on the predetermined position on the supporter without separately providing a mechanism for correcting a shift in the position of the substrate with respect to the hand or a mechanism for correcting a shift in the position of the substrate with respect to the supporter.

Thereafter, various types of processing are performed on the substrate W while the substrate W is accurately placed at the predetermined position on the supporter. Thus, processing accuracy of the substrate W is improved. Further, in the present embodiment, because the plurality of portions at the outer periphery of the substrate W being moved by the hand are detected, it is not necessary to stop the movement of the substrate W in order to detect the shift in the position of the substrate W. Therefore, throughput in the substrate processing is not reduced.

As a result, the processing accuracy of the substrate W can be improved while an increase in cost is suppressed with a simple configuration without reducing the throughput in the substrate processing.

(10-2) In the present embodiment, a hand of each transport mechanism holds the substrate W by sucking the back surface of the substrate W using the plurality of suction portions sm.

When the substrate W is held by the hand while the back surface of the substrate W is sucked, the suction of the substrate W by the suction portions sm must be released in order to correct a shift in the position of the substrate W with respect to the hand.

In the substrate processing apparatus 100 according to the present embodiment, because a shift in the position of the substrate W with respect to the supporter can be corrected without correcting the shift in the position of the substrate W with respect to the hand, it is not necessary to release the suction of the substrate W. Therefore, the throughput in the substrate processing is not reduced.

Further, because the substrate W is moved while being sucked by the plurality of suction portions sm, the position of the substrate W with respect to the hand does not change after the detection of a plurality of portions at the outer periphery of the substrate W by the plurality of detectors 316D. Therefore, the substrate W is accurately placed at a predetermined position on the supporter, whereby the processing accuracy of the substrate W can be further improved.

(10-3) Each of the plurality of detectors 316D emits light at a moving path of the substrate W by a hand and receives reflected light or transmitted light from the moving path as returning light, thereby outputting the light receiving signal. Thus, a plurality of portions at the outer periphery of the substrate W moved by the hand are easily accurately detected in a non-contacting method.

(10-4) In the present embodiment, each controller for transportation respectively detects a plurality of portions at the outer periphery of the substrate W based on the light receiving signals from the plurality of detectors 316D. The controller for transportation corrects the placement coordinates based on a signal output from the upper hand encoder xe1 or the lower hand encoder xe2 in the rotation member 315 at a time point at which each portion at the outer periphery of the substrate W is detected. Thus, a shift between a position of the substrate W to be placed on the supporter by the hand and a predetermined position on the supporter is canceled. Thus, the placement coordinates can be quickly corrected without performing complicated processing such as image processing.

(10-5) In the present embodiment, each of the plurality of transport mechanisms controlled by the plurality of controllers tc1 to tc4 for transportation has two hands. In each transport mechanism, the substrate W is held by the one hand such that a plurality of portions at the outer periphery of the substrate W held by the one hand are detected and the placement information regarding the substrate W held by the one hand is corrected. Further, the substrate W is held by the other hand such that a plurality of portions at the outer periphery of the substrate W held by the other hand are detected and the placement information regarding the substrate W held by the other hand is corrected.

Thus, the substrate W is transported by the two hands for each transport mechanism such that the processing accuracy of the substrate W can be improved while the throughput of the substrate processing is further improved.

(10-6) In each detector 316D, four portions at the outer periphery of the substrate W pass through a space between the emitters 316t and the light receivers 316r such that the four portions at the outer periphery of the substrate W are detected. In the present embodiment, when the four portions at the outer periphery of the substrate W are detected by the four detectors 316D, each controller for transportation may control the transport mechanism to transport the substrate W to the supporter without retreating a hand to the advancing/retreating reference position FBP.

In this case, as described above, the four detectors 316D are preferably arranged at constant intervals on the circular arc ar (FIG. 7(a)) parallel to the inner periphery of the guide Ha (FIG. 7(a)). When a position of the center we of the substrate W is not largely shifted from the normal position cp of the hand, the four portions at the outer periphery of the substrate W can be detected by the four detectors 316D at substantially the same time. Thus, a time period for detecting a plurality of portions at the outer periphery of the substrate W can be shortened. Further, because the hand does not necessarily have to be returned to the advancing/retreating reference position FBP, a moving path of the substrate W is shortened and a time period required to transport the substrate W is shortened.

(11) Other Embodiments (11-1) While a hand of each transport mechanism holds the substrate W by sucking the back surface of the substrate W with the plurality of suction portions sm in the embodiment described above, the invention is not limited to this. The hand of each transport mechanism may have a mechanism that holds an outer edge of the substrate W by abutting against the outer edge of the substrate W instead of the mechanism that sucks the back surface of the substrate W.

In the hand that holds the outer edge of the substrate W, an abutment portion against the outer edge of the substrate W is abraded, so that the substrate W may be held by the hand while being shifted from the normal position cp. In this case, the substrate W may be placed at a position shifted from the position to be placed. Even in this case, a plurality of positions at the outer peripheral edge of the substrate W held by the hand are detected, whereby the substrate W can be accurately placed at a predetermined position on the supporter.

(11-2) In the embodiment described above, each transport mechanism may have not less than three hands. In this case, the processing accuracy of the substrate W can be improved while the throughput of the substrate processing is further improved.

(11-3) While the plurality of emitters 316t of the plurality of detectors 316D emit light from positions below the substrate W toward above the substrate W in the embodiment described above, the invention is not limited to this. The plurality of emitters 316t of the plurality of detectors 316D may emit light from positions above the substrate W toward below the substrate W.

(11-4) While the plurality of light receivers 316r of the plurality of detectors 316D are arranged to receive transmitting light emitted from the plurality of emitters 316t and passing through a moving path of the substrate W as returning light in the embodiment described above, the invention is not limited to this. The plurality of light receivers 316r may be arranged to receive reflection light from the moving path of the substrate W emitted from the plurality of emitters 316t as the returning light.

(11-5) While a plurality of portions at the outer periphery of the substrate W held by a hand are detected by the optical sensor device 316 in the embodiment described above, the invention is not limited to this. The plurality of portions at the outer periphery of the substrate W held by the hand may be detected by another sensor device such as an ultrasonic sensor.

Further, a projecting/photoreceiving-type line sensor formed to extend along at least part of the outer periphery of the substrate W may be used instead of the sensor device 316. In this case, at least part of the outer periphery of the substrate W is detected by the line sensor, and a shift in the position of the substrate W is detected based on the detection result.

(11-6) While the resist cover film is formed on the substrate W by the coating processing unit 129 in the coating processing chamber 32, 34 in the embodiment described above, the resist cover film does not have to be formed in the coating processing chamber 32, 34 if a water-resistant resist film is formed in the coating processing chamber 21, 23.

Note that, when the resist cover film is not formed on the substrate W, the coating processing chambers 32, 34 do not have to be provided, or another processing such as the resist film formation or the development processing may be performed in the coating processing chamber 32, 34.

(11-7) The exposure device 15 that performs the exposure processing for the substrate W using a liquid immersion method is used as an external device of the substrate processing device 100 in the embodiment described above, the invention is not limited to this. The exposure device that performs the exposure processing for the substrate W without using a liquid may be used as an external device of the substrate processing apparatus 100.

(12) Correspondences Between Constituent Elements in Claims and Parts in Preferred Embodiments In the following paragraphs, non-limiting examples of correspondences between various elements recited in the claims below and those described above with respect to various preferred embodiments of the present invention are explained.

In the embodiment described above, the substrate W is an example of a substrate, the substrate processing apparatus 100 is an example of a substrate processing apparatus, the support member m, the spin chucks 25, 35, 98, the spin chucks of the cleaning/drying processing units SD1, SD2 and the support member of the placement/cooling unit P-CP are examples of a supporter.

Further, the thermal processing unit PHP, the adhesion reinforcement processing unit PAHP, the cooling unit CP, the coating processing unit 129, the development processing unit 139, the edge exposure unit EEW, the cleaning/drying processing units SD1, SD2 and the placement/cooling unit P-CP are examples of a processing unit, the hands H1, H3, H5, H7 are respective examples of a first holder, the transport mechanisms 127, 128, 137, 138, 141, 142, 146 are examples of a transport device and the coordinates information is an example of control information.

Further, the memory tm of the controllers tc1 to tc4 for transportation is an example of a storage, the controllers tc1 to tc4 for transportation are examples of a controller, the plurality of detectors 316D are examples of a plurality of detectors and the suction portion sm is an example of a suction holding mechanism.

Further, the spin chucks 25, 35, 98 and the spin chucks of the cleaning/drying processing units SD1, SD2 are examples of a rotating and holding device, the nozzles 28a, 28b, the slit nozzle 38, the light emitter 99 and the cleaning liquid supply mechanisms of the cleaning/drying processing units SD1, SD2 are examples of a film processing device, the nozzle 28b is an example of a film removal mechanism, the light emitter 99 is an example of a light irradiation mechanism, the support plates sp of the thermal processing unit PHP, the adhesion reinforcement processing unit PAHP and the cooling unit CP and the support plate of the placement/cooling unit P-CP are examples of a temperature processing device, the support member m and the support member of the placement/cooling unit P-CP are examples of a support member and the hand H2, H4, H6, H8 are respective examples of a second holder.

While preferred embodiments of the present invention have been described above, it is to be understood that variations and modifications will be apparent to those skilled in the art without departing the scope and spirit of the present invention. The scope of the present invention, therefore, is to be determined solely by the following claims.

We claim:

1. A substrate processing apparatus that performs processing on a substrate, comprising:
   a processing unit that has a supporter supporting the substrate and is configured to perform the processing on the substrate held by the supporter;
   a transport device that has a first holder configured to hold the substrate and to be capable of linearly advancing and retreating, and is configured to transport the substrate by moving the first holder;
   a storage that stores first control information for controlling the transport device such that the first holder of the transport device places the substrate at a predetermined position on the supporter of the processing unit;
   a controller that controls the transport device based on the first control information stored by the storage; and
   a plurality of not less than three detectors provided to detect a plurality of not less than three portions at an outer periphery of the substrate being moved by the first holder before the first holder places the substrate on the supporter, so as to detect a shift between a position of the substrate on the supporter and the predetermined position, wherein
   the plurality of detectors are arranged along a circular arc that corresponds to the outer periphery of the substrate on a first path on which the first holder advances and retreats, and configured to emit light to the first path and receive reflection light or transmitting light from the first path as returning light to generate output signals indicating presence/absence of receipt of the returning light as detection results, and
   the controller is configured to detect time points at which the plurality of portions at the outer periphery of the substrate are detected by the plurality of detectors based on the output signals of the plurality of detectors when the first holder advances or retreats on the first path, to correct the first control information based on the detected respective time points before the first holder places the substrate on the supporter, in order to correct such shift between the position of the substrate on the supporter and the predetermined position, and to control the transport device based on the corrected first control information, to reposition the substrate at the predetermined position on the supporter.

2. The substrate processing apparatus according to claim 1, wherein
the first holder has a suction holding mechanism that applies suction to one surface of the substrate.

3. The substrate processing apparatus according to claim 1, wherein
the supporter includes a rotating and holding device that holds and rotates the substrate in a horizontal attitude, and
the processing unit further includes a film processing device that performs processing on a film on the substrate held by the rotating and holding device.

4. The substrate processing apparatus according to claim 3, wherein
the film processing device includes a film removal mechanism configured to remove a peripheral edge of the film on the substrate held by the rotating and holding device.

5. The substrate processing apparatus according to claim 3, wherein
the film processing device includes a light irradiation mechanism configured to irradiate a peripheral edge of the film on the substrate held by the rotating and holding device with exposure light.

6. The substrate processing apparatus according to claim 1, wherein
the processing unit further includes a temperature processing device that performs temperature processing on the substrate, and
the supporter includes a supporting member that supports the substrate on an upper surface of the temperature processing device.

7. The substrate processing apparatus according to claim 1, wherein
the transport device further has a second holder configured to hold the substrate and to be capable of linearly advancing and retreating, and is configured to transport the substrate by moving the second holder,
the storage stores second control information for controlling the transport device such that the second holder of the transport device places the substrate at the predetermined position of the supporter of the processing unit,
the plurality of detectors are provided to detect a plurality of not less than three portions at an outer periphery of the substrate being moved by the second holder before the second holder places the substrate on the supporter, are arranged along a circular arc that corresponds to the outer periphery of the substrate on a second path on which the second holder advances and retreats, and are configured to emit light to the second path and receive reflection light or transmitting light from the second path as returning light to generate output signals indicating presence/absence of receipt of the returning light as detection results, and
the controller is configured to detect time points at which the plurality of portions at the outer periphery of the substrate are detected by the plurality of detectors based on the output signals of the plurality of detectors when the second holder advances or retreats on the second path, to correct the second control information based on the detected respective time points before the second holder places the substrate on the supporter such that a shift between a position of the substrate to be placed on the supporter by the second holder and the predetermined position is canceled, and to control the transport device based on the corrected second control information.

* * * * *